US012663458B2

(12) United States Patent
Charbonniaud et al.

(10) Patent No.: US 12,663,458 B2
(45) Date of Patent: Jun. 23, 2026

(54) METHOD FOR CHARACTERIZING IN PULSE MODE A III-V SEMICONDUCTOR TRANSISTOR AND ASSOCIATED TEST BENCH

(71) Applicant: AMCAD ENGINEERING, Limoges (FR)

(72) Inventors: Christophe Charbonniaud, Chabrignac (FR); Nicolas Labrousse, Aixe-sur-Vienne (FR); Maxime Faure, Limoges (FR)

(73) Assignee: AMCAD ENGINEERING, Limoges (FR)

( * ) Notice: Subject to any disclaimer, the term of this patent is extended or adjusted under 35 U.S.C. 154(b) by 150 days.

(21) Appl. No.: 18/698,280

(22) PCT Filed: Aug. 30, 2022

(86) PCT No.: PCT/IB2022/058094
§ 371 (c)(1),
(2) Date: Apr. 3, 2024

(87) PCT Pub. No.: WO2023/062452
PCT Pub. Date: Apr. 20, 2023

(65) Prior Publication Data
US 2024/0410931 A1 Dec. 12, 2024

(30) Foreign Application Priority Data
Oct. 14, 2021 (FR) ...................................... 2110920

(51) Int. Cl.
*G01R 31/26* (2020.01)

(52) U.S. Cl.
CPC ..... *G01R 31/2607* (2013.01); *G01R 31/2601* (2013.01)

(58) Field of Classification Search
None
See application file for complete search history.

(56) References Cited

U.S. PATENT DOCUMENTS

| | | | |
|---|---|---|---|
| 5,404,109 | A | 4/1995 | Pribble |
| 5,905,384 | A | 5/1999 | Inoue |
| 6,396,298 | B1 | 5/2002 | Young |
| 6,943,561 | B2 | 9/2005 | Verspecht |

(Continued)

OTHER PUBLICATIONS

E. Rahman et al., Journal of Nanoelectronics and Optoelectronics 12, 81 (2017). (Year: 2017).*

(Continued)

*Primary Examiner* — Rodney E Fuller
(74) *Attorney, Agent, or Firm* — NIXON & VANDERHYE

(57) ABSTRACT

A method for characterizing in pulse-mode a III-V semiconductor transistor (2) utilizes an associated test bench (1). An RF pre-pulse is applied to the gate (2a) of the transistor (2) with a power level NRF defined according to a first predetermined law of variation so as to fix the charge state of the traps in the transistor (2). Then a first DC pulse and a second DC pulse are applied to the gate (2a) and to the drain (2b) of the transistor (2), respectively. The first DC pulse and the second DC pulse have a first DC level N1 and a second DC level N2, respectively, defined according to a second predetermined law of variation.

11 Claims, 13 Drawing Sheets

(56) References Cited

U.S. PATENT DOCUMENTS

| | | |
|---|---|---|
| 7,230,444 B2 | 6/2007 | Saito |
| 7,242,200 B2 | 7/2007 | Okawa |
| 7,403,031 B2 | 7/2008 | Okawa |
| 7,486,067 B2 | 2/2009 | Bossche |
| 7,616,014 B1 | 11/2009 | Sobolewski |
| 7,633,308 B1 | 12/2009 | Sobolewski |
| 9,476,933 B2 | 10/2016 | Joh |
| 10,067,185 B2 | 9/2018 | Coignus |
| 10,884,046 B1 | 1/2021 | Tsironis |
| 2003/0057964 A1 | 3/2003 | Verspecht |
| 2006/0145708 A1 | 7/2006 | Saito |
| 2006/0273807 A1 | 12/2006 | Okawa |
| 2007/0279081 A1 | 12/2007 | Okawa |
| 2015/0160285 A1 | 6/2015 | Joh |
| 2015/0171898 A1* | 6/2015 | Blin ........................ H10D 86/01 |
| | | 257/390 |
| 2017/0317598 A1* | 11/2017 | Ptacek .............. H02M 3/33592 |

OTHER PUBLICATIONS

R, Kim, et al., IEEE Transactions on Electron Devices, vol. 62, No. 3, Mar. 2015. (Year: 2015).*

International Search Report and Written Opinion of the ISAW w/English translation for PCT/IB2022/058094, mailed Dec. 1, 2022, 16 pages.

French Search Report w/English translation for FR 2110920, dated May 18, 2022, 17 pages.

Nakkala Poornakarthik, "Pulsed I-V and RF characteruzatation and modeling of AlGaN HEMTs and Graphene FETs", Jun. 18, 2015, pp. 1-191.

Gibiino Gian Piero et al., "Double-pulse characterization of GaN-on-Sapphire FETs for technology development", 2016 21ST Inter-national Conference on Microwave, Radar and Wireless Commu-nications (MIKON), IEEE, May 9, 2016, pp. 1-4.

Gibiino Gian Piero et al., "Isotrap Pulsed IV Characterization of GaN HEMTs for PA Design", US, vol. 28, No. 8, Aug. 31, 2018, IEEE Microwave and Wireless Components Letters, pp. 672-674.

Alberto Santarelli et al., "A Double-Pulsed Technique for the Dynamic I/V Characterization of GaN FETs", IEEE Microwave and Wireless Components Letters, Feb. 2014, 4 pages.

Corrado Florian, et al., "A Prepulsing Technique for the Character-ization of GaN Power Amplifiers With Dynamic Supply Under Controlled Thermal and Trapping States", IEEE Transations on Microwave Theory and Techniques, vol. 65, No. 12, Dec. 2017, 17 pages.

João L. Gomes et al., "An Accurate Characterization of Capture Time Constants in GaN HEMTs", IEEE Transactions on Microwave Theory and Techniques, vol. 67, No. 7, Jul. 2019, 10 pages.

C. Charbonniaud et al., "Electrothermal and trapping effects characterisa-tion of AlGaN/GaN HEMTs", 11th GAAS Symposium—Munich, 2003, 4 pages.

Raymond Quéré et al., "Impact of trap effects on the large signal dynamics of Gallium Nitride field effect transistors", 18èmes Journées Nationales Microondes, Paris, May 2013, 8 pages.

O. Jardel et al., "Modeling of Trap Induced Dispersion of Large Signal Dynamic Characteristics of GaN HEMTs", IEEE, 2013, 4 pages.

C. Charbonniaud et al., "Power Performance Evaluation of AlGaN/ GaN HEMTs through Load Pull and Pulsed I-V Measurements", 12th GAAS Symposium, Amsterdam, 2004, 4 pages.

Nakkala Poornakarthik, "Chapter I: Development of Pulsed Mea-surement setup for GaN HEMTs and Graphene FETs", Electronique des Hautes Frequences, Photonique et Systemes, Universite de Limoges, 2015, 16 pages.

\* cited by examiner

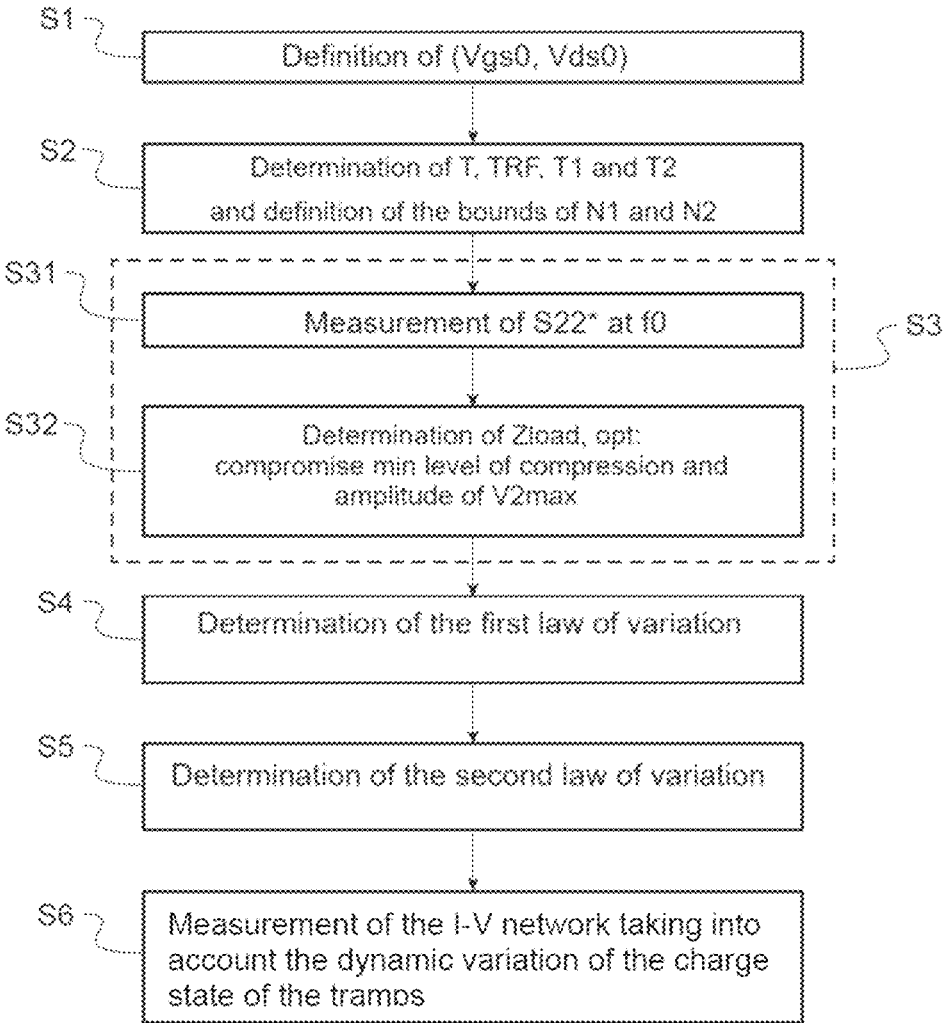

S1     Definition of (Vgs0, Vds0)

S2     Determination of T, TRF, T1 and T2
       and definition of the bounds of N1 and N2

S31    Measurement of S22* at f0                    S3

S32    Determination of Zload, opt:
       compromise min level of compression and
       amplitude of V2max S4     Determination of the first law of variation S5     Determination of the second law of variation S6     Measurement of the I-V network taking into
       account the dynamic variation of the charge
       state of the tramps

Fig.5

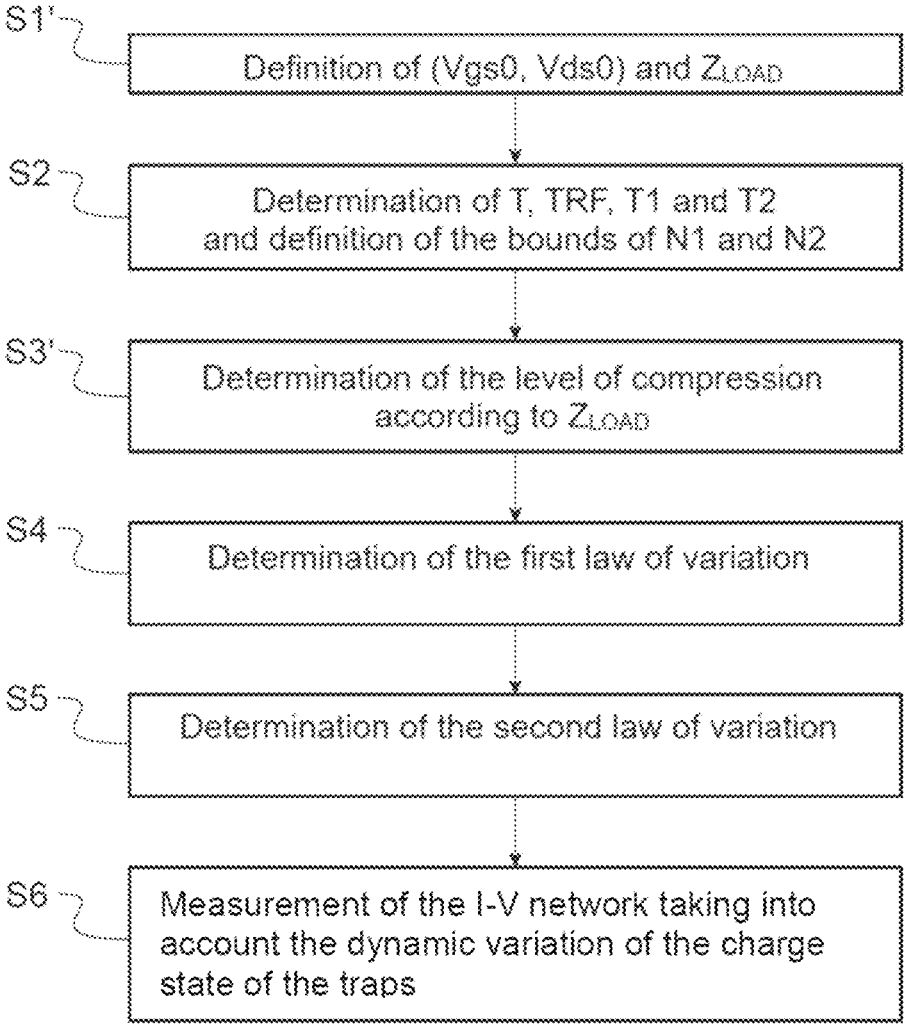

S1' — Definition of (Vgs0, Vds0) and $Z_{LOAD}$

S2 — Determination of T, TRF, T1 and T2 and definition of the bounds of N1 and N2

S3' — Determination of the level of compression according to $Z_{LOAD}$

S4 — Determination of the first law of variation

S5 — Determination of the second law of variation

S6 — Measurement of the I-V network taking into account the dynamic variation of the charge state of the traps

Fig.13

METHOD FOR CHARACTERIZING IN PULSE MODE A III-V SEMICONDUCTOR TRANSISTOR AND ASSOCIATED TEST BENCH

This application is the U.S. national phase of International Application No. PCT/IB2022/058094 filed Aug. 30, 2022 which designated the U.S. and claims priority to FR 2110920 filed Oct. 14, 2021, the entire contents of each of which are hereby incorporated by reference.

The present invention relates to the field of methods for characterizing transistors, and relates more particularly to a method for characterizing in pulse mode a III-V semiconductor transistor, making it possible to take into account the dynamic variation of charge state of the traps in the transistor, and to an associated test bench.

Nowadays, III-V semiconductor transistors, such as GaN transistors, are used in many fields of application (e.g. telecommunications, military and industrial). This GaN-based technology provides a high power density, and allows high operating frequencies to be achieved, two essential features, in particular for radio frequency (RF) amplification applications.

On the other hand, the phenomenon of traps is present and has a significant impact on the actual performance which can be reached with this technology. These traps result from impurities or defects in the crystal lattice or on the surface thereof. The study of these traps is essential in order to better understand the mechanisms thereof and limit the effects on the performance of the component and also in order to model the traps for taking them into account during the design phase.

The technique of measuring in pulse mode allows to characterize the transient effects induced by the traps in the transistor while reducing the impact of thermal effects. This measurement method consists in applying pulsed signals to the ports of the component (usually the gate and the drain) and measuring the responses therefrom, namely the resulting voltages and currents. In its standard version, this technique of measuring in pulse mode has two levels (also referred to as a single pulse system). The signal consists of a fixed level (bias level) and a variable level (pulse level). Thereby, it is possible to measure the I-V (current-voltage) characteristics of a component by scanning the variable level (pulsed) around a fixed point (the bias level) and thereby modify the charge state of the traps in the component. Generally, in the standard technique, a first continuous pulse, whose voltage level is constant over the entire period of the first pulse, is applied to the gate of the transistor, and simultaneously, a second continuous pulse, whose voltage level is constant over the entire period of the second pulse, is applied to the drain of the transistor. In the case of a component with sensitivity to drain control and due to the asymmetry of the capture and emission time constants of the traps in the transistor, a single pulse system will have the consequence of fixing the mean level of the traps for VdS<Vds0 and will make the mean level variable for VdS>Vds0 (where VdS is the pulsed drain-source voltage of the transistor, and Vds0 is the drain-source voltage at the bias point).

The understanding of trap phenomena by measurement in pulse mode has improved this technique. A similar reasoning can be made with regard to the gate, but in such case, the absolute value of Vgs (|Vgs|) should be taken into account. One way to take into account the actual charge state of the traps, namely the charge state imposed by the environment of the component in its final application, is to apply a continuous pre-pulse (that is, having a constant voltage level over the entire period of the pre-pulse) in order to condition the charge state of the traps to an adequate level depending on the final application. Thereby, this technique is called a three-level technique (or double-pulse system), namely the two levels of the standard technique and an additional level which is the level of the pre-pulse. Such improved technique thereby serves to fix the charge state of the traps under the use conditions representative of the optimal load line.

The modeling of trap phenomena in III-V semiconductor technologies is a major challenge in the design of microwave circuits. Indeed, such traps lead to a degradation of the expected performance of the component (e.g. reduction in the output power and in the added power efficiency). One way to highlight the effects of traps is to perform I-V measurements in pulse mode at different bias points. It can then be seen that the measured I-V networks differ depending upon the bias point of the transistor. For bias points distant from the bias point Vgs0=0V and Vds0=0V, a decrease in the saturation value of the current and also an increase in the knee voltage are observed, thus leading to a decrease in performance under strong signal conditions.

The double-pulse (or three-level) system has the advantage of fixing the charge state of the traps over the entire I-V network and thereby minimizing the asymmetry of the charge and emission time constants of the traps. Unlike a single-pulse (or two-level) system, in the double-pulse system, the I-V networks are almost identical regardless of the bias point, which is due to the fact that the charge state of the traps is fixed by the pre-pulse and not by the bias point itself. However, in existing double-pulse systems, the pre-pulse level is fixed at a constant level imposing a constant charge state of the traps regardless of the area of the explored I-V characteristic, which does not allow the dynamic effects of the traps in the transistor to be taken into account.

Furthermore, it should also be noted that the amplitude of an RF signal applied to the gate of the transistor also has an impact on the charge state of the traps of the transistor. It has indeed been shown that the charge state of the traps in the transistor is modified depending on the power level applied to the RF signal. Indeed, for microwave applications, the actual excitation signals of the transistors have a high peak-to-average power ratio (PAPR) characteristic. The above means that the envelope of the RF signal varies over time resulting in a large variation in the instantaneous power. The trap effects are transient phenomena which thus vary over time depending upon the levels of the voltages applied to the transistor. Thereby, the charge state of the traps is dynamically affected by the instantaneous variation of the signals and thence the envelope of the RF signal.

Thereby, as presented hereinabove, the bias as well as the amplitude of the envelope of the RF signal modify the charge state of the traps, leading to a dynamic degradation of performance of the transistor.

Taking into account such dynamic effects is thereby essential and requires a more precise characterization and modeling of such phenomena.

However, known I-V measurement techniques in pulse mode (i.e. single-pulse or double-pulse), used to model the transistor output current source, do not make it possible to take into account the dynamic charge states of the traps in the use conditions of the final application and thus do not make it possible to represent the actual behavior of the transistor in its final environment.

The present invention aims to solve the drawbacks of the prior art, by proposing a method for characterizing in pulse mode a III-V semiconductor transistor, wherein a variable RF pre-pulse is previously applied to the transistor gate, then a first direct current (DC) pulse is applied to the transistor gate and a second DC pulse is applied to the transistor drain, the power level of the RF pre-pulse being defined according to a first predetermined law of variation so as to dynamically modify the charge state of the traps in the transistor. The method according to the present invention can thereby be used for the measurement of the I-V network of the transistor taking into account the dynamic variation of the charge state of the traps, which allows a more precise modeling of the transistor output current source under conditions close to the conditions of the final application.

The subject matter of the present invention is thus a method for characterizing in pulse mode a III-V semiconductor transistor, the transistor comprising a gate, a drain and a source, characterized in that said method comprises the following steps:

a) defining a bias point of the transistor, corresponding to a bias gate-source voltage Vgs0 and to a bias drain-source voltage Vds0;

b) defining a load impedance applied to the drain of the transistor;

c) defining a period T, and for each period T: c1) applying a radio frequency (RF) pre-pulse to the gate of the transistor so as to fix the charge state of the traps in the transistor, said RF pre-pulse having a predefined frequency f0, a predefined pre-pulse duration TRF and a power level NRF defined according to a first predetermined law of variation;

c2) after the RF pre-pulse, applying a first direct current (DC) pulse to the gate of the transistor and a second DC pulse to the drain of the transistor, the first DC pulse having a first duration T1 and the second DC pulse having a second duration T2, the first and second durations T1, T2 being at least partially simultaneous, the first DC pulse and the second DC pulse having a first DC level N1 and a second DC level N2, respectively, defined according to a second predetermined law of variation; and c3) during a measurement duration TM during the simultaneous application of the first and second DC pulses, measuring the current Id flowing in the drain of the transistor;

wherein, for each period T, in the first law of variation, the power level NRF of the RF pre-pulse depends on the first N1 and second N2 DC levels of the first and second DC pulses applied subsequently within the same period T;

wherein, for each period T, in the second law of variation, the first DC level N1 is equal to Vgs0 plus a first value V1 defined by the second law of variation according the current period T, and the second DC level N2 is equal to Vds0 plus a second value V2 defined by the second law of variation according to the current period T, the first V1 and second V2 values being real numbers.

III-V semiconductor transistor refers to a transistor including a semiconductor material composed of one or a plurality of group III elements (boron, gallium, aluminum, indium, etc.) and of group V elements (arsenic, antimony, phosphorus, etc.) of the Periodic Table of Mendeleev. For example, gallium nitride (GaN) transistors are III-V semiconductor transistors.

Furthermore, characterizing in pulse mode the transistor means the measurement of currents and voltages at the gate and drain of the transistor when pulse signals are applied to the gate and drain of the transistor, so as to obtain, as an example, a plurality of curves of the drain current as a function of the drain voltage, each of said curves corresponding to a particular gate voltage, all of said curves thus forming an I-V network (or I(V) network or current-voltage network) which allows to characterize the behavior of the transistor under test, in particular to highlight the effects of traps in the transistor.

In the present invention, the RF pre-pulse, whose power level is defined according to a first predetermined law of variation as a function of the DC levels of the first and second DC pulses subsequently applied within the same period T (i.e., as a function of the explored I-V area), thereby serves to dynamically modify the charge state of the traps in the transistor, which makes it possible to know the actual excursion of the extrinsic output current source of the transistor.

Therefore, the present invention makes possible a better assessment of the impact of the traps on the final performance of the application. Also, these measurements can be used to model the output current source of the component, provided that the model is used only at the quiescent bias point fixed during the measurement. In the case where the model is to be valid for different bias points, the characterization method of the present invention should be repeated and the results should be used to determine the trap model with precision.

The pulse mode of the method makes possible a limitation of the effects of self-heating and thus a better separation of the thermal effects and of the effects of traps on the electrical performance of the component.

V1 and V2 can be positive, negative or zero real numbers depending on the period T. The second law of variation allows, over all the periods T of the characterization method, a sequencing of (N1, N2) to be performed around the bias point so as to construct the I-V network of the transistor under test.

A plurality of successive periods T are needed for carrying out the characterization method according to the present invention. At each period T, a RF pre-pulse and then two DC pulses are applied to the transistor under test, the levels NRF, N1 and N2 of the three pulses being defined by the first and second predefined laws of variation. The characterization method ends (i.e. the end of the measurement and the succession of periods T) when the entire I-V network has been explored around the bias point.

According to a particular feature of the invention, the characterization method further comprises, between steps a) and b), a step of determining the period T and the durations TRF, T1 and T2 according to the measurement of the time constants of the traps in the transistor on the gate and on the drain of the transistor.

Thereby, the measurement of the time constants of the traps on the gate ("gate-lag") and the drain ("drain-lag") of the transistor serves to define the different delays so as to prevent any cumulative effect of the trap effects during the measurements.

According to a particular feature of the invention, the characterization method further comprises, between steps a) and b):

d1) defining the lower and upper bounds [Vgsmin; Vgsmax] of the first DC level N1 in the second law of variation, where:

Vgsmax is determined by measuring the gate current Ig of the transistor as a function of the DC voltage Vgs applied to the gate of the transistor for a zero voltage Vds applied to the drain of the transistor, then by defining Vgsmax as the value of Vgs for which the gate current Ig reaches a predetermined current threshold value; and Vgsmin≤Vp where Vp is the pinch-off voltage of the transistor; and d2) defining the lower and upper bounds [Vdsmin; Vdsmax] of the second DC level N2 in the second law of variation, where Vdsmin=0V and Vdsmax=2*Vds0.

It should be noted that the predetermined current threshold value depends on the transistor type.

Advantageously, the bounds of N1 and N2 are defined after the determination of T, TRF, T1 and T2.

According to a particular feature of the invention, the characterization method further comprises, between steps b) and c), a step of determining the first law of variation comprising:

e1) for the defined load impedance applied to the drain of the transistor, measuring the amplitude of Vgs over time at f0 or at a harmonic of f0 as a function of the power Pavs transmitted in an RF pulse at f0 or at a harmonic of f0, then defining different power levels Pavs1, . . . , Pavsn of the RF pulse by cutting the curve of variation of the measured amplitude of Vgs as a function of the power Pavs, each power level Pavs1, . . . , Pavsn corresponding to a certain range of the voltage Vgs;

e2) for the defined load impedance, measuring the curve of variation of the voltage Vgs as a function of the voltage Vds so as to determine possible pairs of values (N1, N2); and e3) for each possible pair of values (N1, N2), determining the corresponding power level NRF to be applied to the RF pre-pulse among the different power levels Pavs1, Pavsn.

Thereby, at each period T, the power level NRF of the RF pre-pulse is one of the different power levels Pavs1, . . . , Pavsn, and is chosen as a function of the DC levels N1 and N2 which will be applied to the two DC pulses within the same period T. The first law of variation thereby takes into account the explored area of the I-V network of the transistor in order to fix the power level NRF of the RF pre-pulse within the period T in question. For each area, and hence for each power level Pavs, the voltage excursions V1 and V2 with respect to the bias point change.

As an example, the different power levels Pavs1, . . . , Pavsn can be defined by cutting the curve of variation of Vgs at constant Vgs step.

According to a first embodiment, the step of defining the load impedance b) comprises:

measuring, at the bias point, the conjugate of the output reflection coefficient S22 of the transistor at frequency f0 and determining a corresponding initial load impedance; performing a measurement combining a power sweep with a variation of the load impedance around said initial load impedance in order to determine the optimum load impedance for which the excursion of voltage Vds is maximum for a minimum compression level; and defining the load impedance as being equal to the determined optimum load impedance.

Thereby, in this first embodiment, the final application is not known (or does not impose any condition on the load impedance and the compression level), and step b) makes it possible to find the optimal load conditions (i.e. the optimal load impedance) of the component under test in order to maximize the measurement area needed for covering the I-V network.

The optimum load impedance is chosen so as to maximize the excursions of the input and output voltages of the transistor while minimizing the compression level of the transistor.

According to a second embodiment, during step b), the load impedance is defined by the user according to the final application, which defines a constraint on the compression level of the transistor.

Thereby, in this second embodiment, the load impedance and the compression level are imposed by the final application of the transistor.

According to a particular feature of the invention, the characterization method further comprises, between steps b) and c), a step of determining the second law of variation comprising:

f1) for at least the first period T, defining V1=0 and V2=0; and f2) for each of the following periods T, defining V1 and V2 so that, over all periods T, N1 and N2 vary around the bias point while gradually moving away from the latter (preferentially according to a spiral representing the charge cycle of the component subjected to a power ramp).

At the bias point (Vgs0, Vds0), the RF power level is zero and then, as the measurement sequence progresses, the DC pulse levels increase and follow a spiral around the bias point, like the actual charge cycle of the component in its final environment (the final application). Also, the power level NRF of the RF pre-pulse increases incrementally (Pavs1, Pavs2, . . . , Pavs11) as the measurement sequence progresses.

According to a particular feature of the invention, the characterization method further comprises, at each period T, the measurement of the S parameters (or small signal parameters or scattering parameters) on the gate and the drain of the transistor during the application of the first and second DC pulses.

Thereby, the S parameters of the transistor can be determined by measuring, using a vector network analyzer, the incident and reflected waves on the gate and the drain of the transistor.

According to a particular feature of the invention, step c3) further comprises: during the measurement duration TM, measuring the gate voltage, the drain voltage and the gate current of the transistor.

Thereby, the measurement of the gate and drain voltages serve e.g. to check whether or not these two voltages have arrived at the level of the set points N1 and N2 and to perform a servo-control until the set points are reached (i.e. the same pair (N1, N2) is applied for a plurality of periods T until this set point is reached, then the drain current can be measured over a predefined number of periods T and then averaged).

A further subject matter of the present invention is a test bench for characterizing in pulse mode a III-V semiconductor transistor, the test bench comprising a pulsed RF generator, a first pulsed DC voltage source associated with a first multimeter configured to measure voltages and currents, a second pulsed DC voltage source associated with a second multimeter configured to measure voltages and currents, a first bias tee and a second bias tee, the pulsed RF generator and the first pulsed DC voltage source being configured to be connected to the transistor gate via the first bias tee, the second pulsed DC voltage source and a load impedance being configured to be connected to the transistor drain via the second bias tee, the test bench further comprising a controller configured to control the pulsed RF generator, the first pulsed DC voltage source and the second pulsed DC voltage source so as to carry out the method for characterizing as described hereinabove.

The pulsed RF Generator is an RF generator of sinusoidal signals in pulse mode.

According to a particular feature of the invention, the test bench further comprises a vector network analyzer configured to be connected to the gate and to the drain of the transistor via couplers.

Thereby, the vector network analyzer allows to measure the incident and reflected waves on the gate and the drain of the transistor under test, in order to determine the corresponding S parameters.

According to a particular feature of the invention, the test bench further comprises at least two wattmeters configured to be connected to the gate and to the drain of the transistor via couplers.

In order to better illustrate the subject matter of the present invention, two preferred embodiments will be described hereinafter, as an illustration, but not limited to, with reference to the appended drawings.

In these drawings:

FIG. 5 is a flowchart representing a method for characterizing in pulse mode according to a first embodiment of the present invention;

FIG. 13 is a flowchart representing a method for characterizing in pulse mode according to a second embodiment of the present invention.

Figure 1:
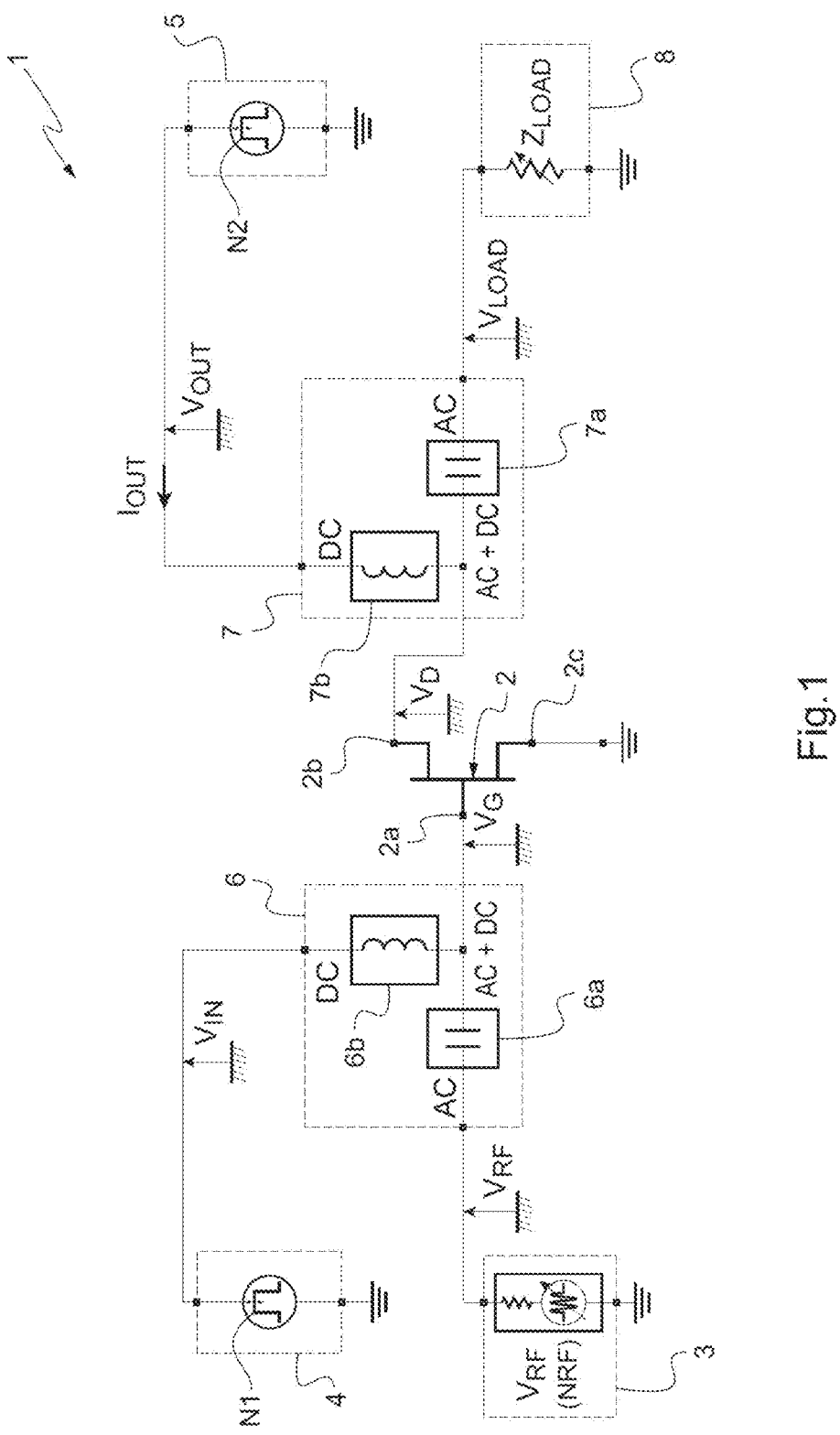
FIG. 1 is a block diagram of a test bench according to the present invention.

Referring to FIG. 1, it can be seen that the block diagram of a test bench 1 according to the present invention is shown therein, for characterizing in pulse mode a transistor 2 which is a III-V semiconductor transistor such as a GaN transistor.

The transistor 2 comprises a gate 2a, a drain 2b and a source 2c connected to ground.

The test bench 1 comprises a pulsed radiofrequency (RF) generator 3, a first pulsed DC voltage source 4, a second pulsed DC voltage source 5, a first bias tee 6 and a second bias tee 7.

The pulsed RF generator 3 and the first pulsed DC voltage source 4 are connected to the gate 2a of the transistor 2 via the first bias tee 6.

The first bias tee 6 comprises a capacitor 6a connected between the pulsed RF generator 3 and the gate 2a of the transistor 2, and an inductance coil 6b connected between the first pulsed DC voltage source 4 and the gate 2a of the transistor 2. Thereby, the first bias tee 6 allows only the passage of AC signals between the pulsed RF generator 3 and the gate 2a of the transistor 2, and only the passage of the DC voltage between the first pulsed DC voltage source 4 and the gate 2a of the transistor 2.

The second pulsed DC voltage source 5 and a load impedance 8 are connected to the drain 2b of the transistor 2 via the second bias tee 7.

The second bias tee 7 comprises a capacitor 7a connected between the drain 2b of the transistor 2 and the load impedance 8, and an inductance coil 7b connected between the second pulsed DC voltage source 5 and the drain 2b of the transistor 2. Thereby, the second bias tee 7 allows only the passage of AC signals between the drain 2b of the transistor 2 and the load impedance 8, and only the passage of the DC voltage between the second pulsed DC voltage source 5 and the drain 2b of the transistor 2.

Preferentially, the value $Z_{LOAD}$ of the load impedance 8 can be modified by means of a load tuning device (or "tuner").

In FIG. 1, $V_{RF}$ corresponds to the voltage at the output of the pulsed RF generator 3, $V_{IN}$ corresponds to the voltage at the output of the first pulsed DC voltage source 4, $V_{out}$ corresponds to the output voltage of the second pulsed DC voltage source 5, $V_G$ corresponds to the gate voltage of the transistor 2, $V_D$ corresponds to the drain voltage of the transistor 2, $V_{LOAD}$ corresponds to the voltage at the terminals of the load impedance 8, and $I_{out}$ corresponds to the drain current (or output current) of the transistor 2.

The pulsed RF generator 3 is configured to generate RF signal pre-pulses with a power level NRF that can be modified at each pre-pulse.

The first pulsed DC voltage source 4 is configured to generate DC signal pulses with a high level N1 that can be modified at each pulse.

The second pulsed DC voltage source 5 is configured to generate DC signal pulses with a high level N2 that can be modified at each pulse.

The block diagram of the test bench 1 further comprises a controller (not shown in FIG. 1) configured to control the pulsed RF generator 3, the first pulsed DC voltage source 4 and the second pulsed DC voltage source 5 so as to delay the different pulses in order to carry out a characterization method on the transistor 2, which will be described in greater detail thereafter.

Prior to the application of the different pulses, a bias point of the transistor 2 has to be defined by the user, said bias point corresponding to a bias gate-source voltage Vgs0 and to a bias drain-source voltage Vds0. Furthermore, the value $Z_{LOAD}$ of the load impedance 8 should also be defined. For example, the transistor 2 can be a high electron mobility transistor (HEMT) obtained by aluminum gallium nitride (AlGaN) or gallium nitride (GaN) technology (e.g. with 0.4 mm of periphery), intended for X-band amplification applications with a frequency of interest $f_0=10$ GHz, and the bias point can be fixed for class AB operation, namely Vgs0=−3.2V and Vds0=20V (i.e. about 100 mA/mm).

Figure 2:
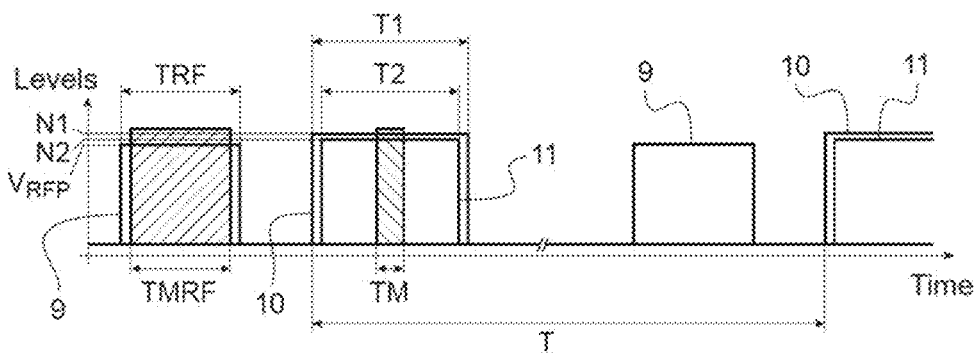
FIG. 2 is an example of timing diagram representing the RF pre-pulse and the two DC pulses of the characterization method according to the present invention.

Referring to FIG. 2, it can be seen that a timing is shown therein as an example of the RF pre-pulse and of the two DC pulses from the pulsed RF generator 3 and from the first and first pulsed DC voltage sources 4 and 5, respectively.

A period T is defined and, for each period T, a RF pre-pulse 9 is applied to the gate 2a of the transistor 2 so as to fix the charge state of the traps in the transistor 2, said RF pre-pulse 9 having a predefined frequency f0, a predefined pre-pulse duration TRF and a power level NRF defined according to a first predetermined law of variation which will be described thereafter. In order not to overload FIG. 2, the RF pre-pulse 9 has only been represented as a square wave. In reality, the resulting time signal denoted by $V_{RF}(t)$ is described by the following equations:

$$V_{RF}(t) = \begin{cases} V_{RFP}.\cos(2\pi f_0 t + \varphi), & t \in [TRF] \\ 0, & t \notin [TRF] \end{cases}$$

where $f_0$ is the frequency of the RF signal, p is the phase of the RF signal, and $V_{RFP}$ is the amplitude of the RF signal that is proportional to the power level NRF delivered by the pulsed RF generator 3.

Thereafter, after the RF pre-pulse 9, a first DC pulse 10 is applied to the gate 2a of the transistor 2 and a second DC pulse 11 is applied to the drain 2b of the transistor 2.

The first DC pulse 10 has a first duration T1 and the second DC pulse 11 has a second duration T2, the first and second durations T1 and T2 being partially simultaneous. It should be noted that, although in FIG. 2 the first duration T1 is greater than the second duration T2 and completely envelops the latter, it would also be possible to have T1=T2 or T2>T1, without departing from the scope of the present invention.

The high level N1 of the first DC pulse 10 and the high level N2 of the second DC pulse 11 are defined according to a second predetermined law of variation which will be described thereafter.

Thereby, for each period T, the first and second laws of variation define particular values for NRF, N1 and N2.

Each of the first and second DC pulses 10, 11 has a high level (N1 and N2 respectively) and a low level (corresponding to the x-axis in FIG. 2).

The RF and DC pulse signals 9, 10, 11 are synchronized and have the common period T.

In addition to the time evolution of the signals generated by the RF pulse source 3 and the DC pulse sources 4, 5, the timing diagram shown in FIG. 2 also represents the measurement instants of the signals resulting from the transistor 2.

Thereby, during the simultaneous application of the first and second DC pulses 10, 11, the resulting DC signals (namely, the drain current $I_{OUT}$, and optionally the drain voltage $V_D$, the gate voltage $V_G$ and the gate current) are measured during a measurement duration denoted by TM.

Furthermore, the incident and reflected waves on the gate 2a and the drain 2b of the transistor 2 can also be measured, using a vector network analyzer, during the application of the RF pre-pulse 9 over a measurement duration denoted by TMRF.

The time characteristics of the excitation signals 9, 10, 11 are fixed to ensure that between two measurement points, the output current $I_{OUT}$ has returned to its steady state, thereby preventing any cumulative effect that could affect the obtained measurement results. For this purpose, a preliminary study is carried out in order to determine the time constants of the traps from two time measurements where the gate voltage $V_G$ and the drain voltage $V_D$ are varied, respectively. For example, the time characteristics may be as follows: T1=1 μs, T2=1 μs, TRF=1 μs, T=0.3 s, TM=0.2 μs and TMRF=0.7 μs.

A plurality of successive periods T are needed for carrying out the characterization method according to the present invention. At each period T, a RF pre-pulse 9 and then two DC pulses 10 and 11 are applied to the transistor 2 under test, the levels NRF, N1 and N2 of the three pulses being defined by the first and second predefined laws of variation. The characterization method ends (i.e. the end of the measurement and of the succession of periods T) when the entire I-V network has been explored around the defined bias point Vgs0, Vds0.

Figure 3:
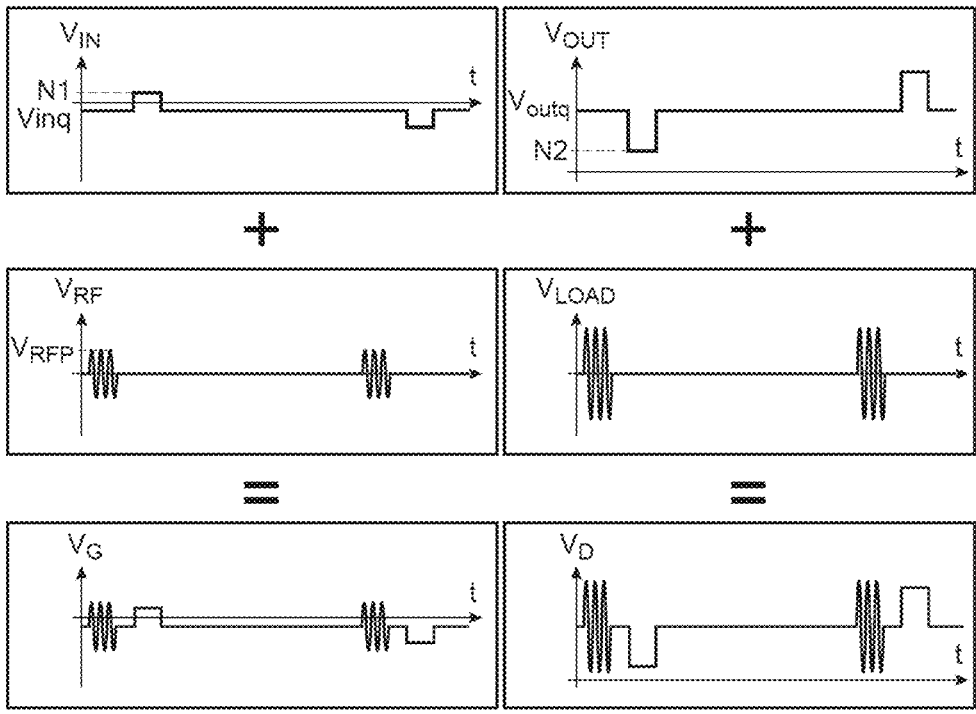
FIG. 3 shows, as an example, different timing diagrams representing the different voltages of the block diagram of FIG. 1.

Referring to FIG. 3, it can be seen that different timing diagrams are represented therein, as an example, representing the different voltages $V_{IN}$, $V_{OUT}$, $V_{RF}$, $V_{LOAD}$, $V_G$ and $V_D$ of the test bench 1 during two successive periods T.

The pulsed DC signal $V_{IN}$ comprises N1 as a variable high level (which depends on the current period T) and Vinq as a fixed low level, and the pulsed DC signal $V_{out}$ comprises N2 as a variable high level (which is a function of the current period T) and Voutq as a fixed low level.

It can be seen that the pulsed DC signals $V_{IN}$ and $V_{OUT}$ and the input RF pre-pulse $V_{RF}$ recombine at the ports $V_G$ and $V_D$ of the transistor 2.

The RF signal at the output of the transistor 2 depends on the input RF signal, the voltage gain of the transistor 2 and the value $Z_{LOAD}$ of the load impedance.

Figure 4:
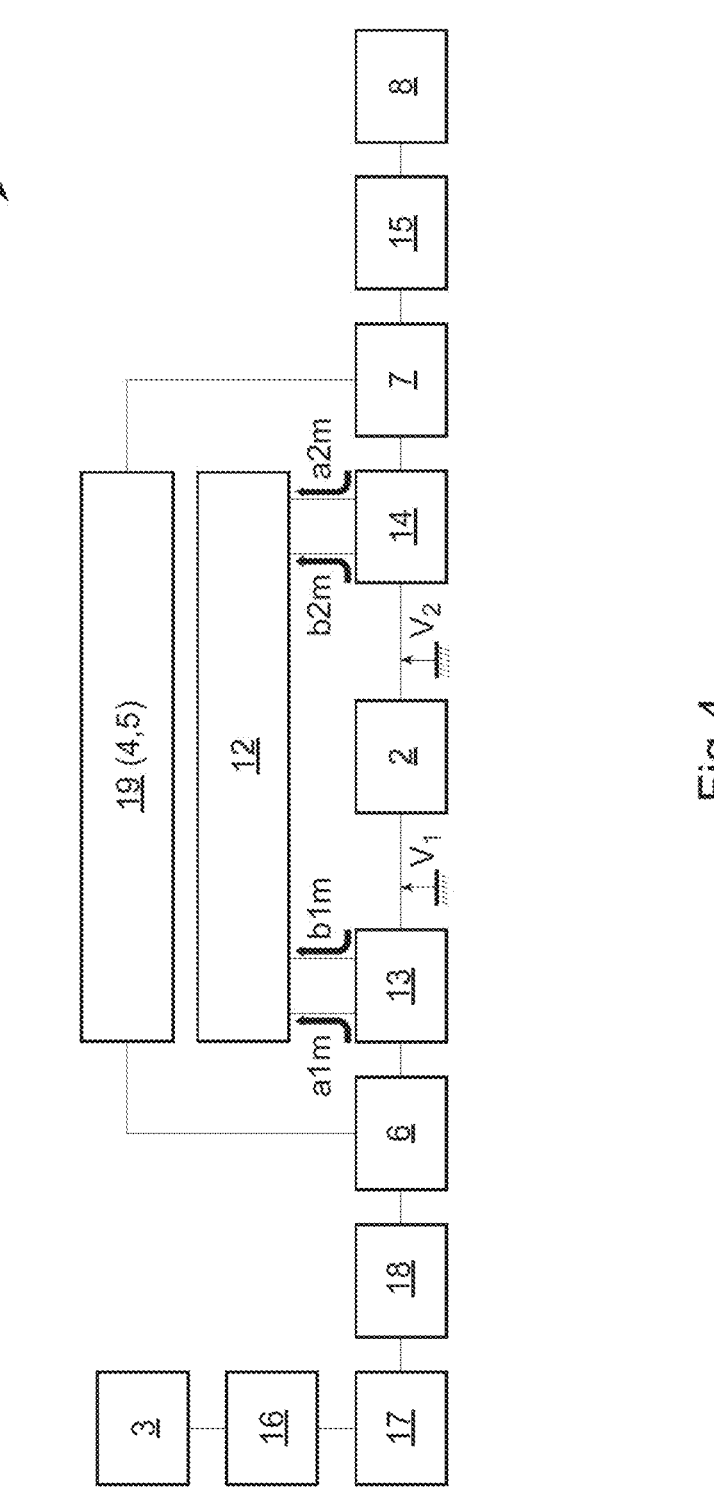
FIG. 4 is a functional diagram of a test bench according to the present invention.

Referring to FIG. 4, it can be seen that another block diagram of the test bench 1 is represented therein, which serves to carry out measurements, under small signals and under large signals in pulse mode while controlling the load conditions of the transistor 2 under test to be characterized.

Compared with FIG. 1, the test bench 1 of FIG. 4 further comprises a vector network analyzer 12 connected to the gate 2a and to the drain 2b of the transistor 2 via two couplers 13 and 14.

The couplers 13 and 14 are used to take a fraction of the incident and reflected waves at the input and the output of the transistor 2 under test in order to transmit them to the vector network analyzer 12.

The vector network analyzer 12 is used to measure the incident and reflected waves (a1m, b1m) and (a2m, b2m), so as to determine the corresponding S parameters of the transistor 2.

In FIG. 4, V1 represents the excursion of the gate voltage (input voltage) with respect to Vgs0 (bias point), and V2 represents the excursion of the drain voltage (or output voltage) with respect to Vds0 (bias point).

The first and second bias tees 6 and 7 enable the DC and RF pulse signals to be transmitted to the transistor 2 under test.

The first and second pulsed DC voltage sources 4 and 5 are integrated into an I-V (current-voltage) pulsed system 19 connected to the couplers 13 and 14 via the bias tees 6 and 7, said I-V pulsed system serving both to generate the DC pulses 10 and 11 and to measure the resulting DC signals such as the drain and gate currents and the drain and gate voltages.

An output load impedance tuning device 15 is connected between the second bias tee 7 and the output load 8 and allows to control the value of the output load impedance 8 presented to the transistor 2 under test, the output load 8 (e.g. 50 Ohms) being dimensioned so as to support the power generated by the transistor 2 under test.

The pulsed RF generator 3 has a variable amplitude at the operating frequency f0, and is connected to the first bias tee 6 successively by means of an instrumentation amplifier 16 which allows to increase the level of the RF signal, and a circulator 17 which prevents the reflected energy (in the event of mismatching of transistor 2) being returned to the instrumentation amplifier 16 and RF generator 3 and damaging them, and an input impedance tuning device 18 which serves to control the input impedance presented to the transistor 2 under test.

Referring to FIG. 5, it can be seen that the flowchart of a characterization method according to a first embodiment of the present invention is represented therein, namely in the case where the final application of the transistor 2 under test is not known or imposes no condition on the load impedance 8 and the compression level of the transistor 2.

This characterization method according to the first embodiment of the present invention comprises the following steps:

S1: definition of the bias point (Vgs0, Vds0);

S2: determination of T, TRF, T1 and T2, and definition of the bounds of N1 and N2;

S3: definition of the load impedance $Z_{LOAD}$ by:

S31: measurement of S22* at f0; and

S32: determination of the optimum load impedance $Z_{load, opt}$ (compromise between minimum compression level and maximum V2 amplitude);

S4: determination of the first law of variation;

S5: determination of the second law of variation; and

S6: measurement of the I-V network taking into account the dynamic variation of the charge state of the traps.

At a minimum, the user should know the bias point (Vds0, Vgs0) of the final application of the transistor 2 under test. During step S1, the user defines the bias point of the transistor 2, corresponding to a bias gate-source voltage Vgs0 and to a bias drain-source voltage Vds0.

Step S2 of the method first allows to determine the values of the period T and of the durations TRF, T1 and T2 of the pulses 9, 10 and 11 according to the measurement of the time constants of the traps in the transistor 2 on the gate 2a and the drain 2b of the transistor 2, so as to prevent any cumulative effect of the trap effects during the measurements.

To determine such values of T, NST, T1 and T2, it should be considered that:

The width of the pulses 9, 10 and 11 should be sufficiently short so as not to generate a self-heating phenomenon at the transistor 2 (e.g. a pulse width of 1 µs is sufficient).

The period T should be large enough not to have a cumulative effect related to the transient nature of the trap phenomena. To this end, a study is carried out to determine the time constants of the traps. This study is divided into two measurements called "gate-lag" (measurement of the delay in establishing the output current related to a pulse on the gate) and "drain-lag" (measurement of the delay in establishing the output current related to a pulse on the drain).

As an example, the measurement conditions for highlighting the "gate-lag" phenomenon can be:

$V_{Ghigh}$=Vp=−3.8V, $V_{Glow}$=−8V and $V_D$=5V (where $V_{Ghigh}$ is the high level of the pulse on the gate, $V_{Glow}$ is the low level of the pulse on the gate, and $V_D$ is the drain voltage), Pulse width: 10 µs, Acquisition window: 1 s.

Figure 6:
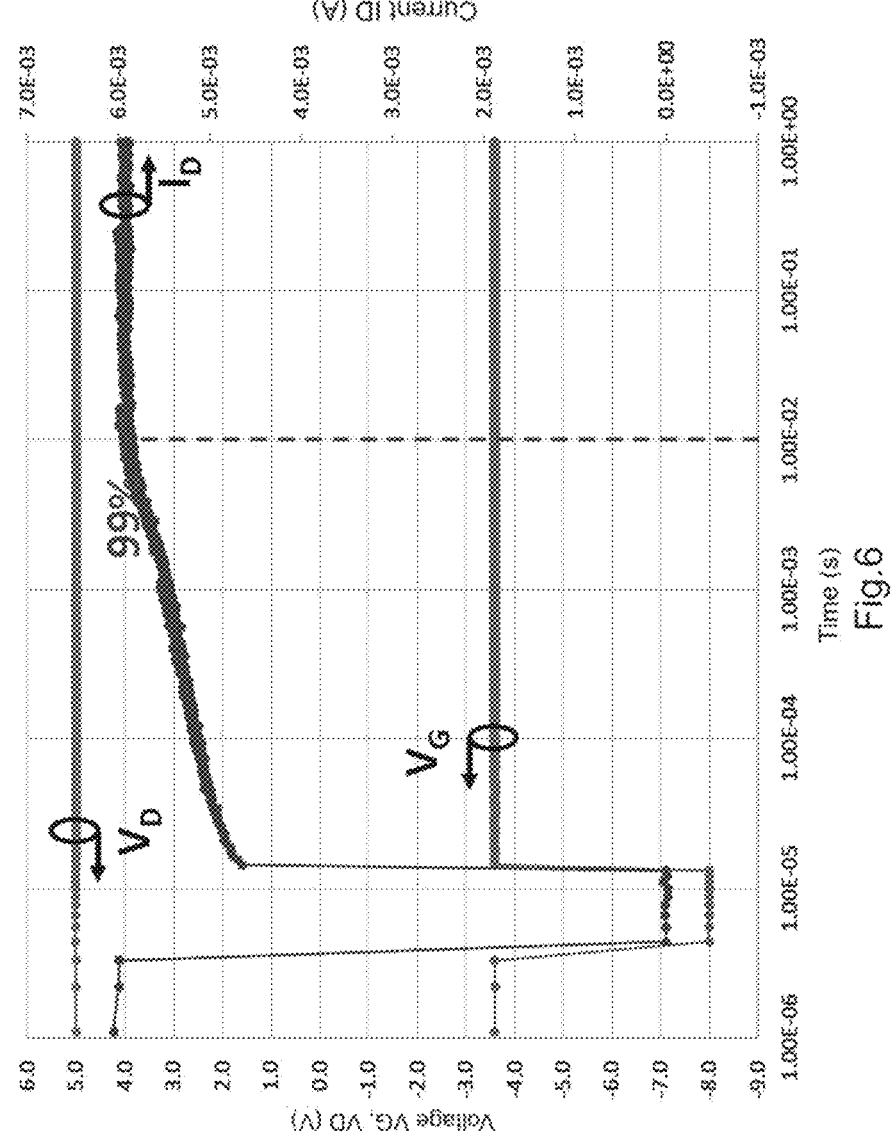
FIG. 6 illustrates, as an example, a "gate-lag" measurement.

Under such conditions, as illustrated in FIG. 6, the variation of the output current $I_D$ clearly shows that the "gate-lag" phenomenon occurs from 20 µs. After a duration of 10 ms, the current $I_D$ has reached approximately 99% of its starting value (before the pulse).

Furthermore, as an example, the measurement conditions for highlighting the drain-lag phenomenon can be:

$V_G$=Vp=−3.8V, $V_{Dlow}$=10V and $V_{Dhigh}$=20V (where $V_G$ is the gate voltage, $V_{Dhigh}$ is the high level of the pulse on the drain, $V_{Dlow}$ is the low level of the pulse on the drain), Pulse width: 10 µs, Acquisition window: 200 ms.

Under such conditions, the evolution of the output current $I_{OUT}$ clearly shows the phenomenon of "drain-lag" emission. After a duration of 100 ms, the current $I_{OUT}$ has reached approximately 99% of its starting value (before the pulse).

Thereby, the drain-lag phenomenon is the phenomenon with the longest time constant (100 ms). Therefore, a period T of 300 ms ensures that there are no cumulative effects related to the traps.

After, in step S2, measurements in DC mode I(V) are then performed on the transistor 2 under test in order to define the bounds of the variable levels N1 and N2 of the two DC pulses 10 and 11.

Specifically, the definition of the bounds of N1 and N2 during step S2 comprises:

defining the lower and upper bounds [Vgsmin; Vgsmax] of the first DC level N1, where: Vgsmax is determined by measuring the gate current I of the transistor 2 as a function of the DC voltage Vgs applied to the gate 2a of the transistor 2 for a zero voltage Vds applied to the drain 2b of the transistor 2, then by defining Vgsmax as being the Vgs value for which the gate current Ig reaches a predetermined current threshold value; and Vgsmin≤Vp where Vp is the pinch-off voltage of the transistor 2; and defining the lower and upper bounds [Vdsmin; Vdsmax] of the second level N2, where Vdsmin=0V and Vdsmax=2*Vds0.

As an example, for determining the bounds of N1 and N2 on the gate and drain ports of a transistor 2 obtained with a GaN-based HEMT technology, it is useful, for the gate port, to know the pinch-off voltage Vp and the maximum gate voltage.

To determine Vp, a measurement in DC mode of the output current Ids as a function of the gate voltage Vgs is performed, and then the transconductance $$Gm = \frac{dIds}{dVgs}$$

is calculated. By applying a linear regression on the linear part of Gm, the pinch-off voltage Vp is determined to be at the intersection of this curve with the x-axis when Gm=0S.

From a practical point of view, it may be interesting to limit the I-V network for the values of Vgs<Vp because the drain current will be mainly zero. However, in such particular embodiment, a different approach has been chosen which consists in setting the minimum value on the gate (Vgsmin) as being the voltage symmetrical to the maximum value (Vgsmax) with respect to the bias voltage (Vgs0). Meaning:

$$Vgsmin < Vgs0 < Vgsmax \text{ and } |Vgsmin - Vgs0| = |Vgsmax - Vgs0|.$$

To determine Vgsmax, an I-V measurement in DC mode is performed at VdS=0V and the characteristic Ig=f(Vg) is plotted. A stop condition is set during the measurement so that the gate current does not exceed a certain threshold (e.g. 10 mA which is below the maximum value set at 2 mA/gate finger, i.e. 16 mA for an 8-finger component (2 mA*8 gate fingers)). Thereby, when, as an example, Vgsmax=1.4V is found for a bias point (Vgs0=−3.2V, Vds0=20V), by applying the previously set rules, with Vgs0=−3.2V and Vgsmax=1.4V, it is obtained:

$$Vgsmin = Vgs0 - |Vgsmax - Vgs0| = -3.2 - 4.6 = -7.8 \text{ V}.$$

Finally, it was decided to limit the minimum and maximum values on the gate voltage between −7.6V (Vgsmin) <−3.2V (Vgs0)<1.2V (Vgsmax), in order to limit the reverse voltage (Vgsmin) on the gate port and also to have a constant step of 0.4V for Vgs during the measurement.

With regard to the excursions on the drain port, the following rule is established:

$$Vdsmin = 0 \text{ V} = Vds0 = 20 \text{ V} < Vdsmax = 2 * Vds0 = 40 \text{ V}.$$

This step of determining the limits of the double-pulse I-V measurement is not specific to the GaN-based technology and could also be applied to other III-V technologies (e.g. GaAs-based).

Step S3, which is needed when the load impedance 8 of the final application of the transistor 2 is not known, then serves to define the load impedance $Z_{LOAD}$ applied to the drain 2b of the transistor 2. To this end, during sub-step S31, the conjugate of the output reflection coefficient S22 of the transistor 2 at the frequency f0 is measured under small signal (RF pulsed/continuous wave) conditions at the bias point using the vector network analyzer 12, which makes it possible to determine a corresponding initial load impedance, i.e. the load impedance that serves as a starting point for finding an optimal load impedance. Thereby, the initial load impedance is determined by measuring, under small signal conditions, the output reflection coefficient S22 at the bias point of interest (in the present example, −3.2V, 20V) at the frequency of interest f0=10 GHz. Its conjugate S22* is then deduced (e.g. S22*=0,447L89.53°), which allows to obtain the initial load impedance $Z_{LOAD, INIT}$=33.57+37.47i.

After, during sub-step S32, a measurement under large signal (RF pulsed/continuous wave at Vgs0, Vds0) conditions is then performed by varying the amplitude of the RF signal for a set of load impedances around said initial load impedance, and then determining the optimum load impedance $Z_{load, opt}$ for which the excursion of V2 is maximum for a minimum compression level, then the load impedance 8 is defined as being equal to the determined optimum load impedance $Z_{load, opt}$.

The first law of variation is a function of the load impedance 8 of the transistor 2 and is thereby a compromise between the compression level and the input V1 and output V2 voltage excursions of the component. It is thereby sought to maximize the excursions of the input voltage V1 and output voltage V2 of the transistor 2 while minimizing the compression level of the transistor 2.

The measurement under large signal conditions performed during step S32 is a so-called "load-pull" measurement for which the load impedance of the component and the RF input power (Pavs) are varied.

The so-called "load-pull" measurement consists in applying a power ramp to the gate port of the transistor 2 for different output load conditions at the frequency of interest f0. It should be noted that it would also be possible to control the impedances at harmonics (n*F0), without departing from the scope of the present invention.

Figure 7:
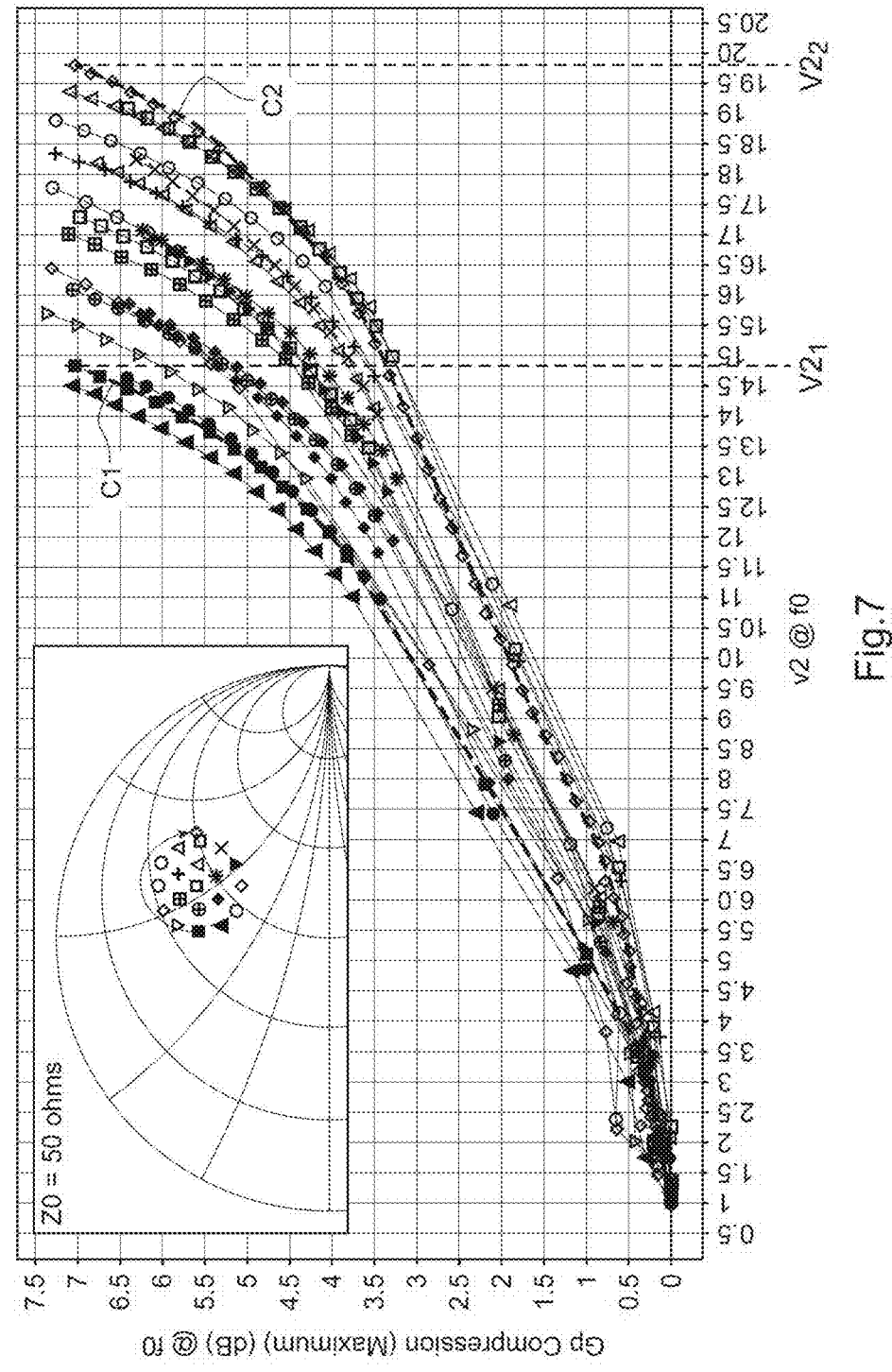
FIG. 7 shows, as an example, different curves of the compression level of the transistor under test as a function of the drain voltage excursion of the transistor under test, for different load impedance values.

FIG. 7 shows, as an example, the "load-pull" measurement results obtained under large signals conditions for different load impedances (with a RF power varying from −30 dBm to 1.93 dBm). The upper left box of FIG. 7 shows a Smith chart showing the different load impedances, around the initial load impedance, that are used during the "load-pull" measurement. The different curves of FIG. 7 show, for each of the different load impedances around the initial load impedance, the gain compression characteristic Gp (in dB at f0) of the transistor 2 as a function of the output voltage V2 excursion. The optimum load impedance $Z_{load, opt}$ is then determined by choosing the compression curve which allows to obtain the maximum output voltage V2 excursion with the minimum compression, and which thus allows to cover the largest measurement area.

For example, in FIG. 7, curve C1 serves to obtain a maximum output voltage excursion $V2_1$=14.8V for a compression of 7 dB, while curve C2 serves to obtain a maximum output voltage excursion $V2_2$=19.8V for a compression of 7 dB. In this example, the load impedance corresponding to curve C2 is thereby chosen as the optimum load impedance (i.e., $Z_{LOAD, OPT}$=48.7±79.7i).

Then, during step S4, the first law of variation is determined with the optimum load impedance $Z_{LOAD, OPT}$ as the load impedance 8.

During step S4, the curve of variation of the gate voltage V1 excursion as a function of the power Pavs transmitted in a RF pulse at f0 is measured, and different power levels Pavs1, . . . , Pavsn of the RF pulse are defined by dividing said curve of variation of V1, each power level Pavs1, . . . , Pavsn corresponding to a certain range of the voltage V1, then the curve of variation of the gate voltage V1 excursion as a function of the drain voltage V2 excursion is measured in order to determine the possible pairs of values (N1, N2) and, for each pair (N1, N2), the corresponding power level NRF to be applied to the RF pre-pulse 9 among the different power levels Pavs1, . . . , Pavsn.

Thereby, at each period T, the power level NRF of the RF pre-pulse 9 is one of the different power levels Pavs1, . . . , Pavsn, and is chosen according to the levels N1 and N2 which will be applied to the two DC pulses 10 and 11 within the same period T. The first law of variation thereby takes into account the explored area of the I-V network of the transistor 2 in order to fix the power level NRF of the RF pre-pulse 9 within the period T in question.

Thereby, for each area, and thus for each power level Pavs, the V1 and V2 voltage excursions with respect to the bias point change.

For example, the different power levels Pavs1, . . . , Pavsn can be defined by dividing the curve of variation of V1 at constant V1 step (e.g. a 0.4V step).

Ideally, the power level NRF of the RF pre-pulse 9 should vary continuously so that the transition from one measurement area to another is as representative as possible of the variation of the signal amplitude. In practice, a determined number of power levels Pavs1, . . . , Pavsn is defined.

Figure 8:
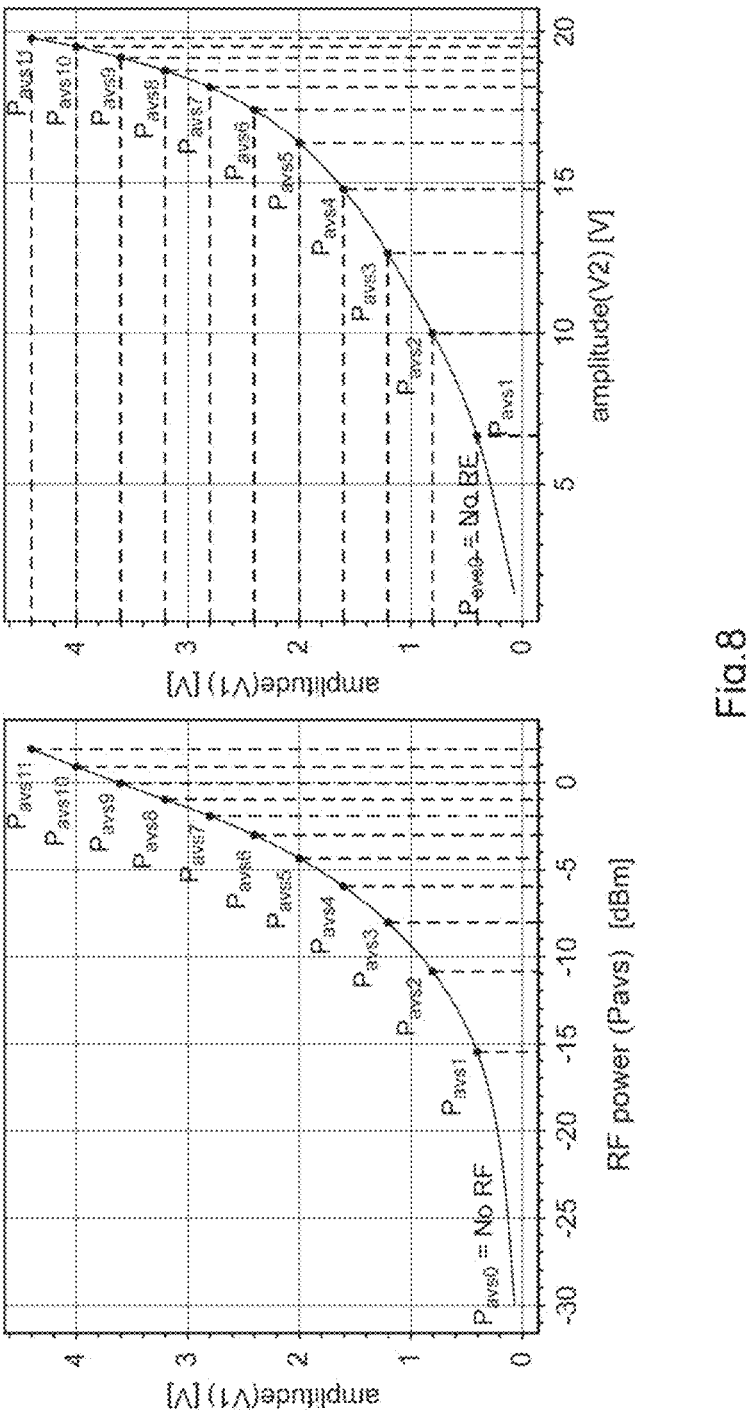
FIG. 8 shows an example curve of the gate voltage excursion of the transistor under test as a function of the power of an RF pulse applied to the gate of the transistor under test, as well as an example curve of the gate voltage excursion of the transistor under test as a function of the drain voltage excursion of the transistor under test.

FIG. 8 shows, as an example, on the left, the result of the measurement of the amplitude variation of the voltage V1 as a function of the RF power Pavs, and, on the right, the result of the measurement of the amplitude variation of the voltage V1 as a function of the amplitude of the voltage V2. The right-hand side curve in FIG. 8 thereby gives the correspondence of the amplitude levels V2 for each level of Pavs and hence each level of V1.

The division of the different power levels Pavs1, . . . , Pavs11 presented in this example is done so as to have a constant input voltage step (V1) of 0.4V. Other approaches are possible depending on needs. For example, a division for a non-linear voltage step of the input voltage.

Loaded on the previously determined optimum load impedance ($Z_{LOAD}$, $O_{PT}$=48.7+79.7i), the system is thereby able to reach excursions of the input voltage V1 of +/−4.4 V and of the output voltage V2 of +/−19.8 V, which corresponds to input levels (N1) between −7.6V and 1.2V (−3.2V+/−4.4V) and to output levels (N2) between 0.2V and 39.8V (20V+/−19.8V).

The RF power level changes according to the explored I-V network area. For each area, and hence for each power level Pavs, the excursions of voltages V1 and V2 change.

Table 1 below shows a summary of the different Pavs levels (Pavs1, . . . , Pavs11) as a function of the pulsed input (N1) and output (N2) voltage excursions. In the present example, 11 power levels Pavs1, . . . , Pavs11 are defined (12 if one considers the first measurement point at −3.2V, 20V for which the RF power Pavs0 of the RF pre-pulse 9 is zero). As an example, for Pavs5, the power level NRF of the RF pre-pulse 9 is −4.34 dBm, which corresponds to pulsed DC voltage excursions comprised between −5.2V and −1.2V (−3.2V+/−2V) at the input (N1) and comprised between 3.66V and 36.34V (20V+/−16.4V) at the output (N2).

TABLE 1

| Pavs | | V1 | N1 (V) | | V2 | N2 (V) | |
| # | dBm | (V) | min. | max. | (V) | min. | max. |
| --- | --- | --- | --- | --- | --- | --- | --- |
| 0 | No RF | 0.00 | −3.20 | −3.20 | 0.00 | 20.00 | 20.00 |
| 1 | −15.47 | 0.40 | −3.60 | −2.80 | 6.66 | 13.34 | 26.66 |
| 2 | −10.84 | 0.80 | −4.00 | −2.40 | 10.02 | 9.98 | 30.02 |
| 3 | −8.02 | 1.20 | −4.40 | −2.00 | 12.62 | 7.38 | 32.62 |
| 4 | −5.93 | 1.60 | −4.80 | −1.60 | 14.75 | 5.25 | 34.75 |
| 5 | −4.34 | 2.00 | −5.20 | −1.20 | 16.34 | 3.66 | 36.34 |
| 6 | −3.06 | 2.40 | −5.60 | −0.80 | 17.40 | 2.60 | 37.40 |
| 7 | −1.96 | 2.80 | −6.00 | −0.40 | 18.13 | 1.87 | 38.13 |
| 8 | −0.96 | 3.20 | −6.40 | 0.00 | 18.73 | 1.27 | 38.73 |
| 9 | −0.03 | 3.60 | −6.80 | 0.40 | 19.15 | 0.85 | 39.15 |
| 10 | 0.93 | 4.00 | −7.20 | 0.80 | 19.52 | 0.48 | 39.52 |
| 11 | 1.93 | 4.40 | −7.60 | 1.20 | 19.78 | 0.22 | 39.78 |

Thereafter, the second law of variation can be determined during step S5 wherein, for at least the first period T, V1=0 and V2=0 (i.e. N1=Vgs0, N2=Vds0 and NRF=Pavs0) and, for the following periods T, V1 and V2 are chosen in such a way that, over all the periods T, N1 and N2 vary around the bias point (Vgs0, Vds0) while gradually moving away from the latter. Thereby, the I-V network of the transistor 2 is explored in such a way that, over all the periods T of the method, the variation of the pair (N1, N2) around the bias point forms a spiral representing the charge cycle of the component subjected to a power ramp.

Figure 9:
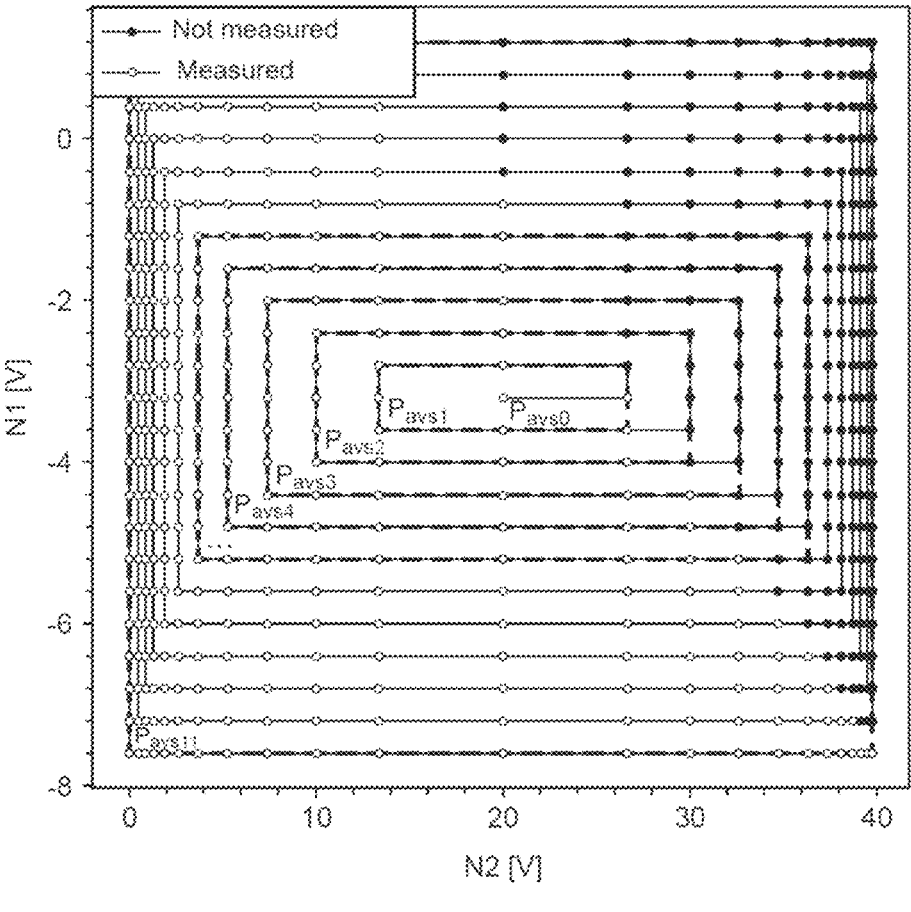
FIG. 9 is an example of a diagram representing the different pairs (N1, N2) used during the characterization method of the present invention.

As shown in FIG. 9, at the bias point (N1=Vgs0, N2=Vds0), the RF power level is zero (Pavs0) and then, as the measurement sequence progresses, the levels N1 and N2 of the DC pulses 10 and 11 increase and describe a spiral around the bias point, in the manner of the actual charge cycle of the component. Also, the power level NRF of the RF pre-pulse 9 increases incrementally (Pavs1, Pavs2, . . . , Pavs11) as the measurement sequence progresses.

Unlike the so-called classical method generally used to measure an I-V network from a single-pulse system (consisting in varying the output voltage (Vds) when the input voltage (Vgs) is fixed and repeating the procedure for different values of Vgs (the drawback of such method being that the method is not representative of the variation of the real signal around the bias point)), the method of the present invention allows to describe the I-V network by rotating around the bias point, in the same way as a charge cycle. As the RF power NRF increases, the levels N1 and N2 move further and further away from the bias point in order to sweep the entire I-V network.

FIG. 9 shows the variation of the input (N1) and output (N2) DC pulse voltages. The measurement sequence is represented by the solid line connecting the different measurement points of the I-V network. Each dotted area is measured for a given power level among Pavs1, . . . , Pavs11. As indicated hereinabove, the first measurement at the bias point (−3.2 V, 20 V) is carried out at zero Pavs (Pavs0).

The set of measurement points (white and black points) in FIG. 9 represents the theoretical total sequence of the I-V measurement performed during step S6.

However, a voltage limitation is set so as not to destroy the transistor 2 during the measurement. Thereby, only the white points are actually measured during step S6 of the method.

It should be noted that in case of multi-bias application, the method is repeated for the different bias points.

The sequencing of the second law of variation thereby consists in delimiting I-V network areas for which the input power Pavs and therefore the level NRF of the RF pre-pulse 9 are fixed, said level NRF increasing incrementally (Pavs1, Pavs2, . . . Pavs11) during the measurement.

During the measurement duration TM, the drain current $I_{OUT}$, the gate voltage $V_G$, the drain voltage $V_D$ and the gate current of the transistor 2 can be measured.

The measurement of the gate voltage $V_G$ and drain voltage $V_D$ allows to verify whether or not these two voltages have arrived at the set points N1 and N2 and to perform a servo-control until the set points are reached (i.e. the same pair (N1, N2) (namely, one of the measurement points in the sequencing in FIG. 9) is applied for a plurality of periods T until this set point is reached), then the drain current is measured over a predefined number (e.g. 10) of periods T and then averaged.

Figure 10:
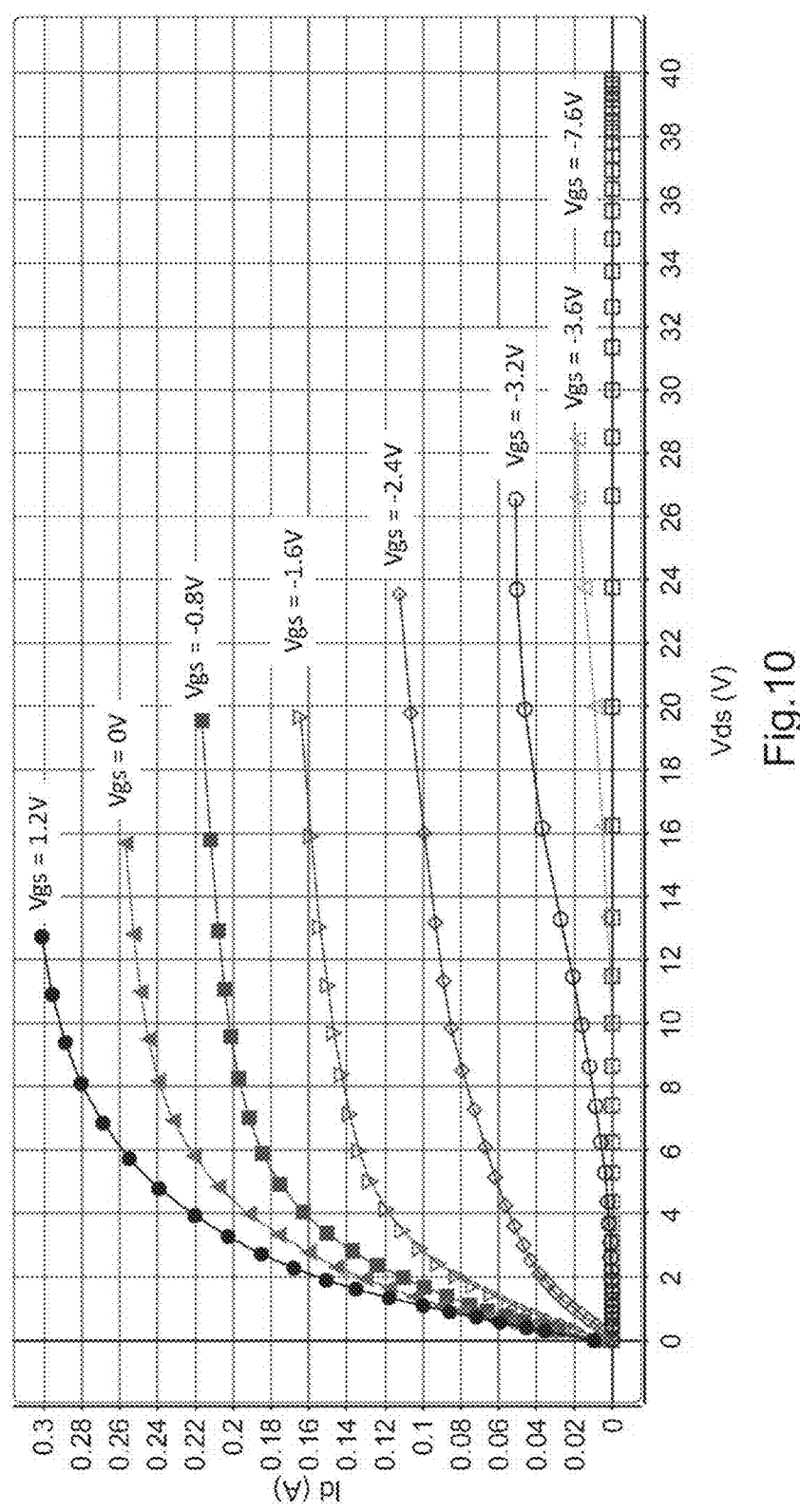
FIG. 10 shows, as an example, an I-V network measured using the characterization method according to the present invention.

FIG. 10 shows, as an example, an I-V network of the transistor 2, measured using the characterization method according to the present invention.

Figure 11:
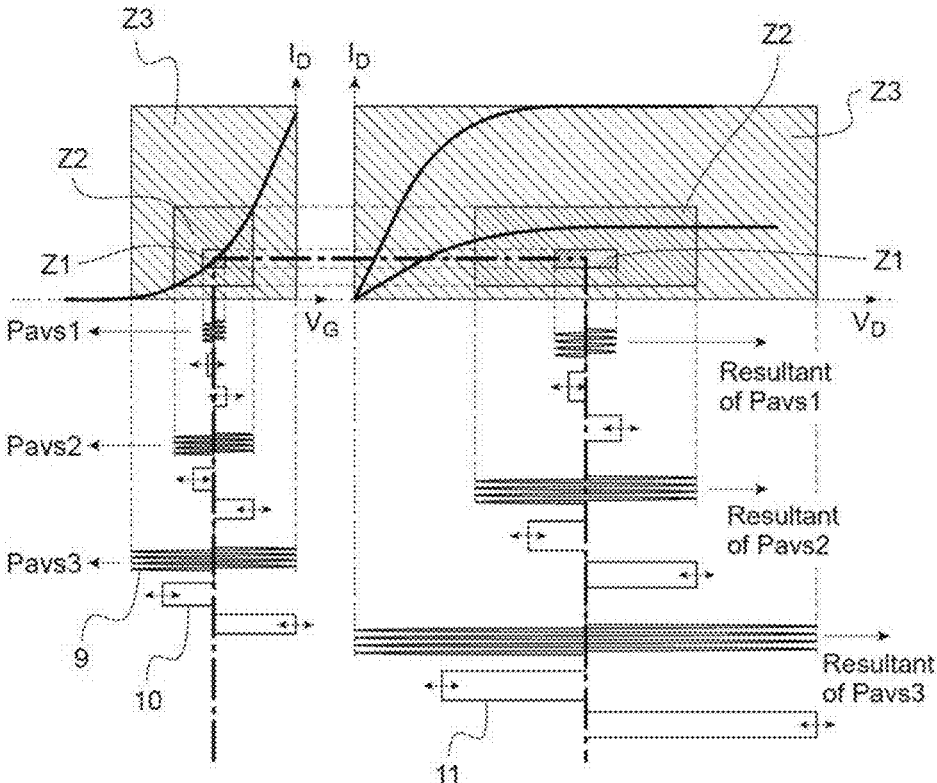
FIG. 11 is an example of a diagram representing three measurement areas of the I-V network corresponding to three different RF power levels in the case of the first embodiment of the present invention.

Referring to FIG. 11, it can be seen that a timing diagram is shown therein as an example of the measurement step S6 of the method according to the first embodiment and the resulting curves $I_D(V_G)$ and $I_D(V_D)$ (where $I_D$ is the drain current) of the measured I-V network, with three measurement areas Z1, Z2 and Z3 of the I-V network corresponding to three different RF power levels Pavs1, Pavs2 and Pavs3, respectively, of the RF pre-pulse 9.

For each period T, the RF pre-pulse 9 is applied to the gate 2a of the transistor 2 with a power level NRF defined according to the first predetermined law of variation (among Pavs1, Pavs2 and Pavs3), so as to fix the charge state of the traps in the transistor 2. A resultant RF signal is then generated on the drain 2*b* of the transistor 2.

After, for each period T, the first DC pulse 10 is applied to the gate 2*a* of the transistor 2 and the second DC pulse 11 is applied to the drain 2*b* of the transistor 2, the first DC level N1 and the second DC level N2 of the two DC pulses 10 and 11 being defined according to the second predetermined law of variation (e.g. according to a sequencing similar to the sequencing shown in FIG. 9).

For each RF power level (Pavs1, Pavs2, Pavs3), a resultant RF power is associated, thereby delimiting the three areas Z1, Z2 and Z3 with constant power level and with fixed charge state of the traps.

In order to keep the charge state of the traps constant, it is essential that the levels of the pulsed DC voltages N1 and N2, used to sweep the I-V network, do not exceed the power levels Pavs1, Pavs2 and Pavs3. In other words, at each power level (Pavs1, Pavs2, Pavs3), the excursions of the input V1 and the output V2 will be contained in the areas delimited by the RF pre-pulse 9 and the resultant thereof.

From the bias point (corresponding to the center of area Z1), the area Z1 corresponding to the power level Pavs1 is first explored by varying N1 and N2 in this area Z1, then the area Z2 corresponding to the power level Pavs2 is explored by varying N1 and N2 in this area Z2, then the area Z3 corresponding to the power level Pavs3 is explored by varying N1 and N2 in this area Z3.

It can be seen that the choice, during step S3, of the optimum load impedance $Z_{load, \, opt}$ as the load impedance 8 makes it possible to cover entirely the I-V network of the transistor 2 under test.

Figure 12:
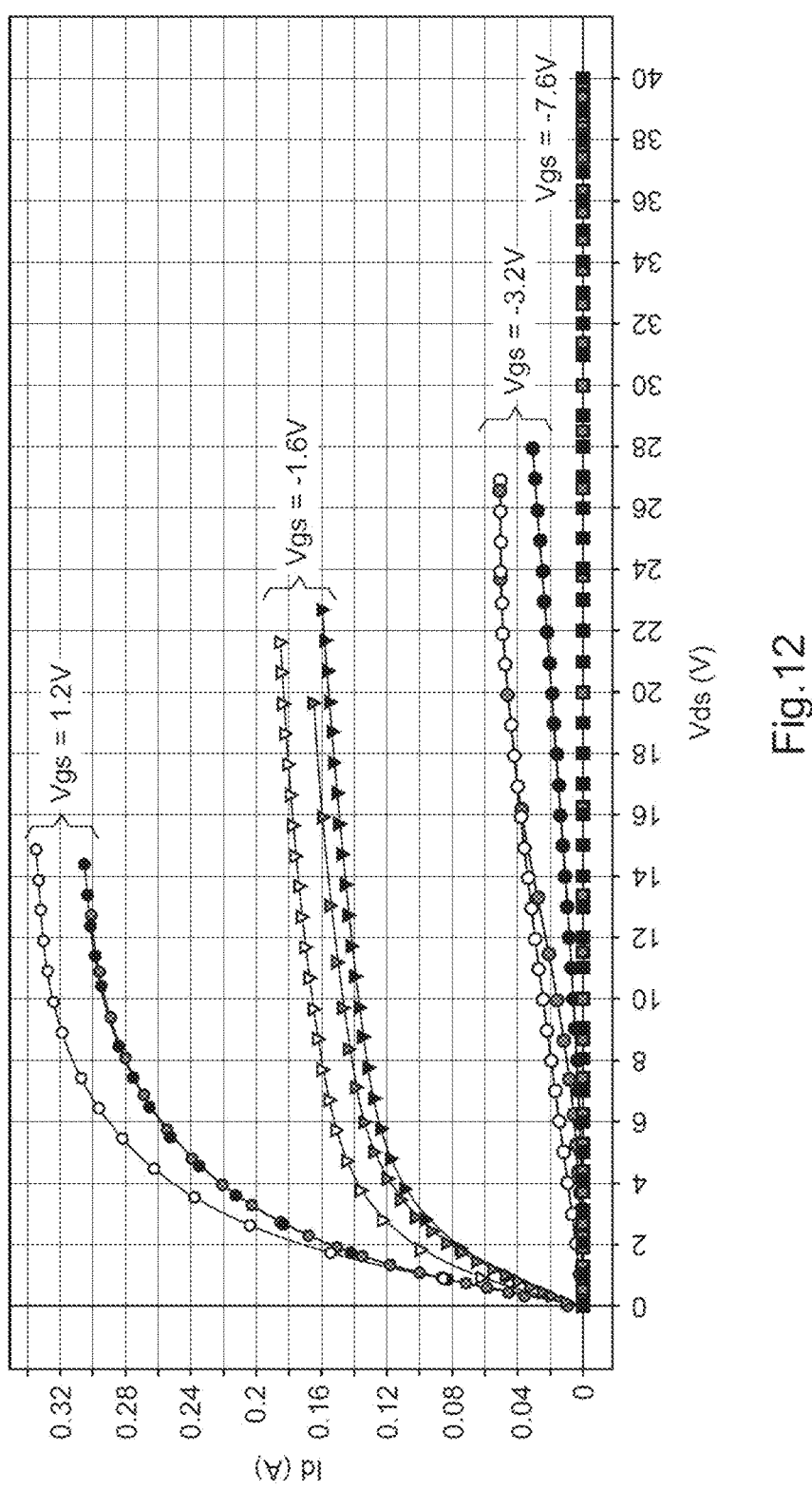
FIG. 12 represents three different I-V networks measured using an existing single-pulse technique, an existing double-pulse technique and the characterization method according to the present invention, respectively.

Referring to FIG. 12, it can be seen a comparison of I-V networks obtained with three different measurement techniques, namely the existing single-pulse technique (curves with white symbols), the existing double-pulse technique with fixed and maximum level RF pre-pulse (curves with black symbols), and the characterization method according to the present invention with variable level RF pre-pulse (curves with gray symbols).

We thus see that:

For the single-pulse I-V network, the current is generally higher compared to other I-V networks. The above is due to the fact that the charge state of the traps is underestimated because said charge state is fixed mainly by the bias point.

For the double-pulse I-V network with fixed and maximum level RF pre-pulse, the charge state of the traps is well taken into account at high Vgs (Vgs=1.2V). However, at low Vgs (Vgs=−3.2V), the current level is underestimated, because the trap level is too high.

With the characterization method according to the present invention with variable level RF pre-pulse, the charge state of the traps is well taken into account whatever the voltages Vgs and Vds. At low power, the charge state of the traps is mainly fixed by the bias point. As the RF signal level increases, the trap level increases, causing a significant decrease in current.

The measurement technique according to the present invention, based on the use of a variable level RF pre-pulse associated with a sequence of measurement of the points of the specific I-V network thereby serves to dynamically control the charge state of the traps and to obtain the realistic I-V characteristic of the transistor 2.

It should be noted that the addition of RF signals to harmonics and the adaptation of the law of variation of the RF pre-pulse over a wider frequency band could also be performed, without departing from the scope of the present invention. As a result, a fine-tuning of the shape of the charge cycle could be performed, and would be more representative of the functioning thereof.

It should also be noted that the measurement of the parameters under small signal conditions (S parameters) could also be performed during the measurement of the I-V characteristic, without departing from the scope of the present invention. Indeed, the use of the 4-port vector network analyzer 12 is used for the additional measurement of S parameters during the duration TMRF.

Referring to FIG. 13, it can be seen that the flowchart of a characterization method according to a second embodiment of the present invention is represented therein, namely in the case where the final application of the transistor 2 under test and the associated load impedance 8 are known.

The characterization method according to the second embodiment is identical to the method of the first embodiment (shown in FIG. 5) except that:

step S1 shown in FIG. 5 is replaced with step S1': definition of the bias point and of the load impedance $Z_{LOAD}$, and step S3 shown in FIG. 5 is replaced with step S3': determination of the compression level associated with the load impedance $Z_{LOAD}$.

During step S1', the load impedance $Z_{LOAD}$ is defined by the user depending on the final application of the transistor 2 under test.

During step S3', the compression level of the transistor 2 is imposed by the load impedance $Z_{load}$ defined during step S1', which then serves to determine the first law of variation of the RF pre-pulse during step S4.

Figure 14:
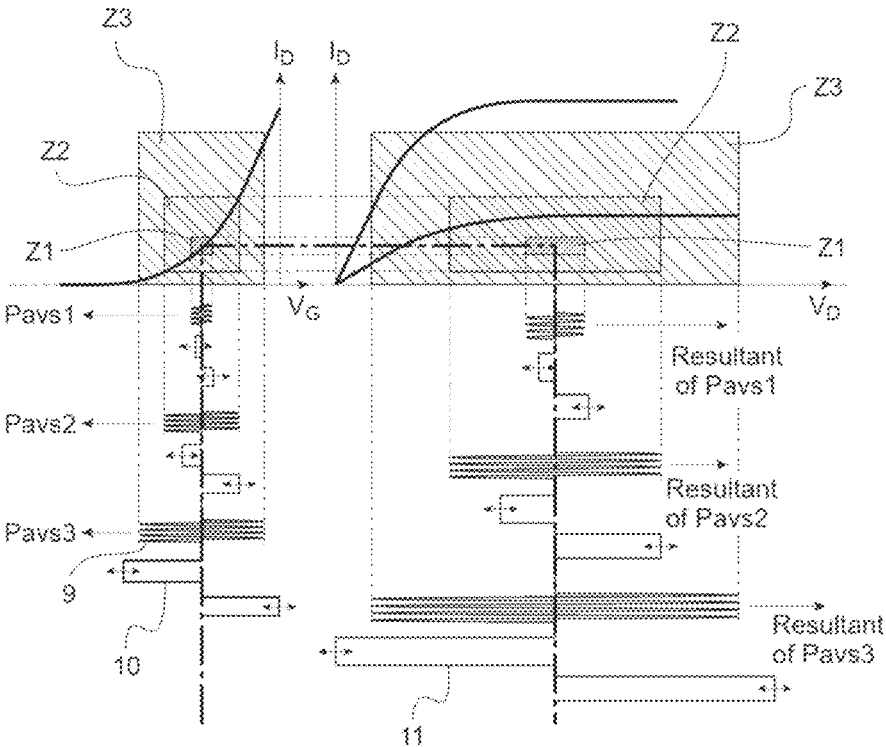
FIG. 14 is an example of a diagram representing three measurement areas of the I-V network corresponding to three different RF power levels in the case of the second embodiment of the present invention.

Referring to FIG. 14, it can be seen that a timing diagram is shown therein as an example of the measurement step S6 of the method according to the second embodiment and the resulting curves $I_D$ ($V_G$) and $I_D$ ($V_D$) of the measured I-V network, with three measurement areas Z1, Z2 and Z3 of the I-V network corresponding to three different RF power levels Pavs1, Pavs2 and Pavs3, respectively, of the RF pre-pulse 9.

Compared with the first embodiment (shown in FIG. 11), given that in the second embodiment the load impedance 8 and the compression level are imposed by the final application, the last area Z3 (corresponding to the last power level Pavs3) of the second embodiment, it is not possible to cover the entire I-V network. In such case, the amplitude of the DC pulses 10 and 11 can be greater than the amplitude of the RF signal in area Z3, so as to make possible the measurement of the entire I-V network without any fear of damaging the transistor 2 under test.

It is understood that the particular embodiments which were just described were given as an indication, and are not limited to, and that modifications can be made thereto without departing from the present invention.

The invention claimed is:

1. A method for characterizing in pulse mode a III-V semiconductor transistor (2), the transistor (2) comprising a gate (2*a*), a drain (2*b*) and a source (2*c*), characterized in that said method comprises the following steps:

a) defining (S1; S1') a bias point of the transistor (2) corresponding to a bias gate-source voltage Vgs0 and to a bias drain-source voltage Vds0;

b) defining (S3; S1') a load impedance (8) applied to the drain (2*b*) of the transistor (2);

c) defining a period T, and for each period T:

c1) applying a radio frequency, RF, pre-pulse (9) to the gate (2*a*) of the transistor (2) so as to fix the charge state of the traps in the transistor (2), said RF pre-pulse (9) having a predefined frequency f0, a predefined pre-pulse duration TRF and a power level NRF defined according to a first predetermined law of variation;

c2) after the RF pre-pulse (9), applying a first DC pulse (10) to the gate (2a) of the transistor (2) and a second DC pulse (11) to the drain (2b) of the transistor (2), the first DC pulse (10) having a first duration T1 and the second DC pulse (11) having a second duration T2, the first and second durations T1, T2 being at least partially simultaneous, the first DC pulse (10) and the second DC pulse (11) having a first DC level N1 and a second DC level N2, respectively, defined according to a second predetermined law of variation; and c3) during a measurement duration TM during the simultaneous application of the first and second DC pulses (10, 11), measuring (S6) the current Id flowing in the drain (2b) of the transistor (2);

wherein, for each period T, in the first law of variation, the power level NRF of the RF pre-pulse (9) depends on the first N1 and second N2 DC levels of the first and second DC pulses (10, 11) applied subsequently within the same period T;

wherein, for each period T, in the second law of variation, the first DC level N1 is equal to Vgs0 plus a first value V1 defined by the second law of variation according to the current period T, and the second DC level N2 is equal to Vds0 plus a second value V2 defined by the second law of variation according to the current period T, the first V1 and second V2 values being real numbers.

2. The method for characterizing according to claim 1, wherein the method further comprises, between steps a) and b), a step f determining (S2) the period T and the durations TRF, T1 and T2 according to the measurement of the time constants of the traps in the transistor (2) on the gate (2a) and on the drain (2b) of the transistor (2).

3. The method for characterizing according to claim 1, wherein the method further comprises, between steps a) and b):

d1) defining (S2) the lower and upper bounds [Vgsmin; Vgsmax] of the first DC level N1 in the second law of variation, where:

Vgsmax is determined by measuring the gate current Ig of the transistor (2) as a function of the DC voltage Vgs applied to the gate (2a) of the transistor (2) for a zero voltage Vds applied to the drain (2b) of the transistor (2), then by defining Vgsmax as the value of Vgs for which the gate current Ig reaches a predetermined current threshold value; and Vgsmin≤Vp where Vp is the pinch-off voltage of the transistor (2); and d2) defining (S2) the lower and upper bounds [Vdsmin; Vdsmax] of the second DC level N2 in the second law of variation, where Vdsmin=0V and Vdsmax=2*Vds0.

4. The method for characterizing according to claim 1, wherein the method further comprises, between steps b) and c), a step of determining the first law of variation (S4) comprising:

e1) for the defined load impedance (8) applied to the drain (2b) of the transistor (2), measuring the amplitude of Vgs over time at f0 or at a harmonic of f0 as a function of the power Pavs transmitted in an RF pulse at f0 or at a harmonic of f0, then defining different power levels Pavs1, . . . , Pavsn of the RF pulse by cutting the curve of variation of the measured amplitude of Vgs as a function of the power Pavs, each power level Pavs1, . . . , Pavsn corresponding to a certain range of the voltage Vgs;

e2) for the defined load impedance (8), measuring the curve of variation of the voltage Vgs as a function of the voltage Vds so as to determine possible pairs of values (N1, N2); and e3) for each possible pair of values (N1, N2), determining the corresponding power level NRF to be applied to the RF pre-pulse (9) among the different power levels Pavs1, . . . , Pavsn.

5. The method for characterizing according to claim 1, wherein in step b) the load impedance (8) is defined (S1') by the user according to the final application, which defines (S3') a constraint on the compression level of the transistor (2).

6. The method for characterizing according to claim 1, wherein the step of defining the load impedance b) comprises:

measuring (S31), at the bias point, the conjugate of the output reflection coefficient S22 of the transistor (2) at the frequency f0 and determining a corresponding initial load impedance;

performing (S32) a measurement combining a power sweep with a variation of the load impedance around said initial load impedance in order to determine the optimum load impedance for which the excursion of voltage Vds is maximum for a minimum compression level; and defining the load impedance (8) as being equal to the determined optimum load impedance.

7. The method for characterizing according to claim 1, wherein the method further comprises, between steps b) and c), a step of determining the second law of variation (S5) comprising:

f1) for at least the first period T, defining V1=0 and V2=0; and f2) for each of the following periods T, defining V1 and V2 in such a way that, over all periods T, N1 and N2 vary around the bias point while gradually moving away from the latter.

8. The method for characterizing according to claim 1, wherein the method further comprises, at each period T, the measurement of the S parameters on the gate (2a) and the drain (2b) of the transistor (2) during the application of the first and second DC pulses (10, 11).

9. The method for characterizing according to claim 1, wherein step c3) further comprises: during the measurement duration TM, measuring the gate voltage, the drain voltage and the gate current of the transistor (2).

10. A test bench (1) for characterizing in pulse mode a III-V semiconductor transistor (2), the test bench (1) comprising a pulsed RF generator (3), a first pulsed DC voltage source (4), a second pulsed DC voltage source (5), a first bias tee (6) and a second bias tee (7), the pulsed RF generator (3) and the first pulsed DC voltage source (4) being configured to be connected to the gate (2a) of the transistor (2) via the first bias tee (6), the second pulsed DC voltage source (5) and a load impedance (8) being configured to be connected to the drain (2b) of the transistor (2) via the second bias tee (7), the test bench (1) further comprising a controller configured to control the pulsed RF generator (3), the first pulsed DC voltage source (4) and the second pulsed DC voltage source (5) so as to carry out the method for characterizing according to claim 1.

11. The test bench (1) according to claim 10, wherein the test bench (1) further comprises a vector network analyzer (12) configured to be connected to the gate (2*a*) and to the drain (2*b*) of the transistor (2) through couplers (13, 14).

* * * * *